(12) United States Patent
Keeth

(10) Patent No.: US 11,869,622 B2
(45) Date of Patent: Jan. 9, 2024

(54) MEMORY WITH FINE GRAIN ARCHITECTURES

(71) Applicant: Micron Technology, Inc., Boise, ID (US)

(72) Inventor: Brent Keeth, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 84 days.

(21) Appl. No.: 17/494,606

(22) Filed: Oct. 5, 2021

(65) Prior Publication Data

US 2022/0139426 A1 May 5, 2022

Related U.S. Application Data

(60) Provisional application No. 63/107,278, filed on Oct. 29, 2020.

(51) Int. Cl.
*G11C 5/06* (2006.01)
*G11C 5/02* (2006.01)
*G11C 5/14* (2006.01)

(52) U.S. Cl.
CPC .............. *G11C 5/063* (2013.01); *G11C 5/025* (2013.01); *G11C 5/148* (2013.01)

(58) Field of Classification Search
CPC .......... G11C 5/063; G11C 5/025; G11C 5/148
USPC ....................................................... 365/244
See application file for complete search history.

(56) References Cited

U.S. PATENT DOCUMENTS

| 10,304,547 | B2 | 5/2019 | Choi et al. |
| 10,740,033 | B2 | 8/2020 | Kim et al. |
| 10,790,039 | B1 | 9/2020 | Lee et al. |
| 2012/0248600 | A1 | 10/2012 | Shigezane et al. |
| 2018/0366443 | A1* | 12/2018 | Keeth ................. H01L 27/0207 |
| 2020/0075567 | A1 | 3/2020 | Collins |
| 2021/0200445 | A1* | 7/2021 | Pawlowski .............. G11C 5/04 |
| 2021/0407942 | A1* | 12/2021 | Yu ........................... H01L 24/06 |

OTHER PUBLICATIONS

"International Search Report and Written Opinion of the International Searching Authority," issued in connection with Int'l Appl. No. PCT/US2021/055886, dated Feb. 7, 2022 (11 pages).

* cited by examiner

*Primary Examiner* — Huan Hoang
(74) *Attorney, Agent, or Firm* — Holland & Hart LLP

(57) ABSTRACT

Methods, systems, and devices for memory with fine grain architectures are described. An apparatus may include a memory device, a first organic substrate, and a second organic substrate. The first organic substrate may include a plurality of first conductive lines arranged with a first pitch that may power one or more components of the memory device. The second organic substrate may be coupled with the memory device and the first organic substrate. The second organic substrate may include a plurality of second conductive lines arranged with a second pitch smaller than the first pitch and may be configured to route signals between the memory device with a host device.

32 Claims, 10 Drawing Sheets

FIG. 7    700

MEMORY WITH FINE GRAIN ARCHITECTURES

CROSS REFERENCE

The present Application for Patent claims priority to U.S. Provisional Patent Application No. 63/107,278 by Keeth, entitled "MEMORY WITH FINE GRAIN ARCHITECTURES," filed Oct. 29, 2020, assigned to the assignee hereof and expressly incorporated by reference herein in its entirety.

FIELD OF TECHNOLOGY

The following relates generally to one or more systems for memory and more specifically to memory with fine grain architectures.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
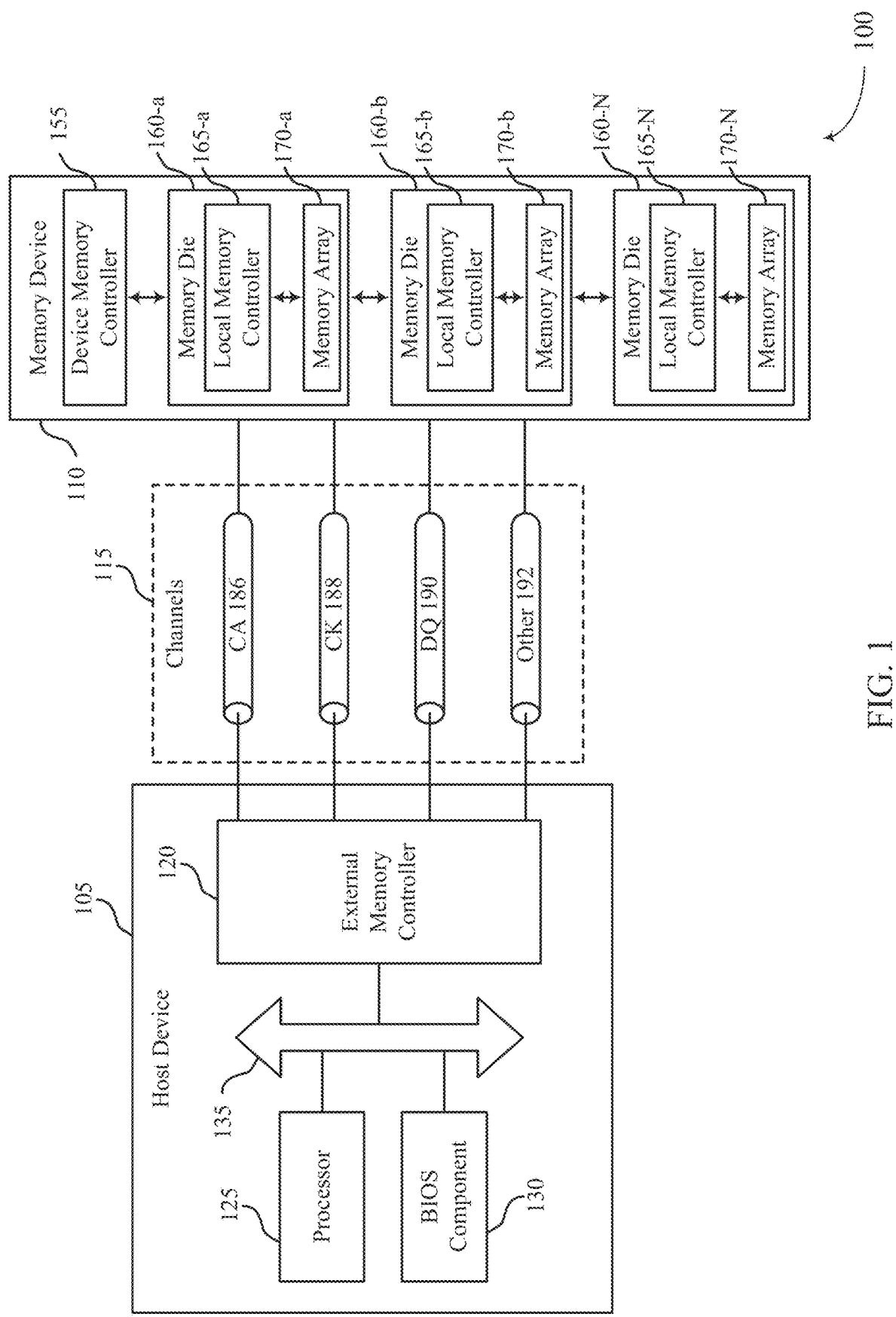
FIG. 1 illustrates an example of a system that supports memory with fine grain architectures in accordance with examples as disclosed herein.

Some systems may include a host device coupled with a memory device by an interposer that routes signals between the host device and the memory device. In some examples, the type of interposer used may cause a signal to lose its strength depending on a distance a channel carrying the signal is routed through the interposer. For example, routing the signal to a relatively far distance through the interpose may cause a signal loss as the signal is communicated between the memory device and the host device—e.g., the signal may degrade more and more the further it travels through the channel routed in the interposer. In such examples, the system may include additional packaging to route the signals between the memory device and the host device to reduce signal loss and the distance the channel is routed through the interposer, but this may increase the complexity and power consumption of the system. Additionally or alternatively, the system may include a buffer between the memory device and the host device. In some examples, the buffer may cause increased power consumption in the system by the components that receive signals, store data, and then redrive the signals. Some memory devices may also include relatively long conductive paths between various components and cause the system to utilize additional power to perform operations (e.g., access operations) over the long conductive paths. For example, the memory device may consume more power when the distance between a memory cell of the memory device and an input/output (I/O) channel is relatively large.

Systems, techniques, and devices are described herein for routing signals between a memory device and host device utilizing a fine grain architecture. For example, the system may include a first organic substrate that provides power to one or more components of the memory device. The system may also include a second organic substrate that has a finer pitch than the first organic substrate that routes signals between the memory device and the host device. The second organic substrate may have a relatively small signal loss and decrease the complexity of manufacturing the system. The system may also include a defined interface (e.g., bump out or ball-out), that also reduces the complexity of manufacturing the system and decreases the distance of conductive paths between various components. For example, a distance between a memory cell of the memory device and an I/O channel may be relatively small, thereby enabling the memory device to reduce power consumption. In some examples, the host device may communicate with the memory device without a buffer (e.g., point to point signaling). By routing signals as described herein, the memory device may increase data transfer rates while reducing the overall power consumption of the system.

Features of the disclosure are initially described in the context of systems and dies as described with reference to FIG. 1. Features of the disclosure are described in the context systems, data channel configurations, memory arrays, memory devices, structures, and devices as described with reference to FIGS. 2-8. These and other features of the disclosure are further illustrated by and described with reference to an apparatus diagram and a flowchart that relate to memory with fine grain architectures as described with reference to FIGS. 9 and 10.

FIG. 1 illustrates an example of a system 100 that supports memory with fine grain architectures in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-*a*, local memory controller 165-*b*, local memory controller 165-A) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The memory die 160 may be an example of a two-dimensional (2D) array of memory cells or may be an example of a three-dimensional (3D) array of memory cells. A 2D memory die 160 may include a single memory array 170. A 3D memory die 160 may include two or more memory arrays 170, which may be stacked on top of one another or positioned next to one another (e.g., relative to a substrate). In some examples, memory arrays 170 in a 3D memory die 160 may be referred to as decks, levels, layers, or dies. A 3D memory dies 160 may include any quantity of stacked memory arrays 170 (e.g., two high, three high, four high, five high, six high, seven high, eight high). In some 3D memory dies 160, different decks may share at least one common access line such that some decks may share one or more of a word line, a digit line, or a plate line.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal). In some examples, the DQ channels 190 may be coupled with the memory device via data pins (e.g., DQ pins).

In some examples, CA channels 186 may be operable to communicate commands between the host device 105 and the memory device 110 including control information associated with the commands (e.g., address information). For example, commands carried by the CA channel 186 may include a read command with an address of the desired data. In some examples, a CA channel 186 may include any quantity of signal paths to decode one or more of address or command data (e.g., eight or nine signal paths).

In some examples, clock signal channels 188 may be operable to communicate one or more clock signals between the host device 105 and the memory device 110. Each clock signal may be operable to oscillate between a high state and a low state, and may support coordination (e.g., in time) between actions of the host device 105 and the memory device 110. In some examples, the clock signal may be single ended. In some examples, the clock signal may provide a timing reference for command and addressing operations for the memory device 110, or other system-wide operations for the memory device 110. A clock signal therefore may be referred to as a control clock signal, a command clock signal, or a system clock signal. A system clock signal may be generated by a system clock, which may include one or more hardware components (e.g., oscillators, crystals, logic gates, transistors).

In some examples, data channels 190 may be operable to communicate one or more of data or control information between the host device 105 and the memory device 110. For example, the data channels 190 may communicate information (e.g., bi-directional) to be written to the memory device 110 or information read from the memory device 110.

The channels 115 may include any quantity of signal paths (including a single signal path). In some examples, a channel 115 may include multiple individual signal paths. For example, a channel may be x4 (e.g., including four signal paths), x8 (e.g., including eight signal paths), x16 (including sixteen signal paths), etc.

In some examples, the one or more other channels 192 may include one or more error detection code (EDC) channels. The EDC channels may be operable to communicate error detection signals, such as checksums, to improve system reliability. An EDC channel may include any quantity of signal paths.

In some examples, the memory device 110 may be coupled with the host device 105 through a first organic substrate. That is, the first organic substrate may include the channels 115. The first organic substrate may be deposited on a second organic substrate that is configured to route power to the memory device 110. The first organic substrate may have a finer pitch (e.g., a pitch less than) than the second organic substrate. The first organic substrate may have a relatively small signal loss and may thus be used to configure the host device 105 and memory device 110 to have a point-to-point connection. That is, the memory device 110 may not include buffers to buffer signals received or transmitted to the host device. Additionally, the memory device 110 may be coupled with the first organic substrate through a plurality of interfaces, each interface having a defined preconfigured bump-out or ball-out. This point-to-point connection and the plurality of connections via the interfaces may reduce power consumption and increase a rate of data transfer between the memory device 110 and the host device 105. For example, the increased interfaces may reduce the distance data is driven from the memory cell to an input/output (I/O) area.

Figure 2:
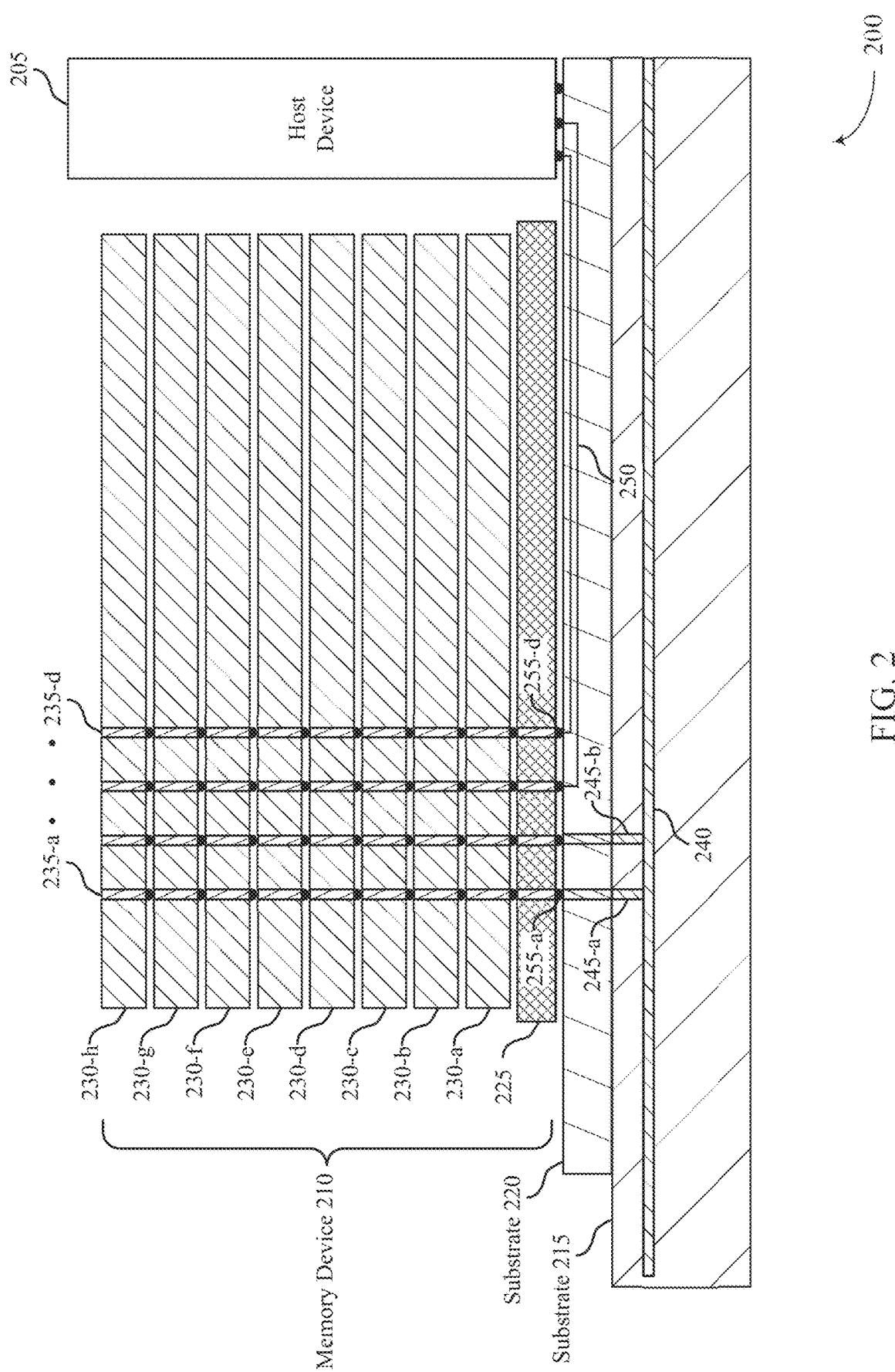
FIG. 2 illustrates an example of system that supports memory with fine grain architectures in accordance with examples as disclosed herein.

FIG. 2 illustrates an example of a system 200 that supports memory with fine grain architectures in accordance with examples as disclosed herein. The system 200 may be an example of system 100 as described with reference to FIG. 1. System 200 may include a host device 205 and a memory device 210 which may be examples of host device 105 and memory device 110, respectively, as described with reference to FIG. 1. Host device 205 may be coupled with the memory device 210 using a substrate 220. The substrate 220 may be coupled with a substrate 215. The memory device 210 may include an operation layer 225 and memory layers 230-a through 230-h. Eight (8) memory layers 230 are shown in FIG. 2 for illustrative purposes only. The memory device 210 may include any quantity of memory layers 230 including one, two, three, four, five, six, seven, eight, nine, ten, eleven, twelve, thirteen, fourteen, fifteen, sixteen, seventeen or more layers.

Host device 205 may be configured to communicate signals, commands, requests, or data to the memory device 210 via the substrate 220 and conductive lines 250 (e.g., channels 115 as described with reference to FIG. 1). In some examples, the host device 205 may be configured to communicate directly with a memory cell or memory array of the memory device 210. That is, the system 200 may include point-to-point connections between the host device 205 and the memory layers 230 of the memory device 210 without the signals been buffered by a buffer layer of the memory device 210. In such examples, the host device 205 may be configured to communicate signals along conductive lines 250 directly to a DQ pin of the memory device 210 based on a memory address associated with the signal. For example, the host device 205 may communicate a signal to a first DQ pin based on a first memory address associated with an access command (e.g., a read, write, or refresh command). In such examples, by sending a signal directly to the DQ pins, the host device 205 may effectively be communicating directly with the memory cells. By enabling the host device 205 to have a point-to-point connection with the memory device 210, the overall power consumption of the system 200 may decrease and the performance time of the system 200 may increase. That is, the lack of a buffer layer may rid the system 200 of extraneous drivers and receivers configured to buffer signals between the host device 205 and the memory device 210 reducing power consumption and increasing a rate of data transfer.

Substrate 215 may include conductive line(s) 240 that are configured to supply power to one or more components of the memory device 210. The conductive line(s) 240 may be configured to supply a ground voltage or a voltage with a magnitude larger than a ground voltage. In some examples, the substrate 215 may include pins (e.g., channels or through silicon-vias (TSVs)) 245 to supply the power from the conductive line(s) 240 to the memory device 210. That is, although not shown for clarity, the pins 245 extend through the memory device 210 up to the upper most memory layer, the memory layer 230-h. The pins 245 may be configured to supply the power to the memory device 210 straight through the operation layer 225 and the memory layers 230 (e.g., a straight-up or perpendicular configuration). That is, the pins 245 may be perpendicular to the memory device 210 and be at a same column position for each memory layer 230 and thus may provide power to each memory layer 230 at the same column position.

In some examples, the substrate 215 may be an organic substrate. In such examples, the substrate 215 may be manufactured with a pitch constraint that is greater than a pitch constraint of the substrate 220. For example, the substrate 215 may have a pitch greater than or equal to ten (10) micrometers (μm). Additionally, the substrate 215 may be manufactured with a line parameter or space parameter (e.g., a width and pitch of a metal trace) greater than a line parameter and space parameter of the substrate 220. For example, the substrate 215 may have a line parameter or a space parameter greater than or equal to ten (10) μm.

Substrate 220 may be coupled with the memory device 210, the host device 205, and the substrate 215. In some examples, the substrate 220 may include conductive lines 250 to route signals between the memory device 210 and the host device 205 (e.g., routing commands, requests, or data). In some examples, the substrate 220 may be a fine pitch organic substrate. Substrate 220 may be manufactured as a polyimide spin-on organic polymetric dielectric. That is, substrate 220 may be a polyimide dielectric that is deposited on to the substrate 215 utilizing a spin-on approach. In other examples, the substrate 220 may be deposited on the substrate 215 utilizing other deposition techniques (e.g., chemical vapor deposition (CVD), physical vapor deposition (PVD), or any combination thereof). In either example, the substrate 220 may be deposited directly on to substrate 215—e.g., without ball packaging or other column supports between the substrate 215 and the substrate 220. In some examples, the conductive lines 250 may have an impedance less than an impedance of a conductive line of a silicon interposer. That is, the conductive lines 250 may experience lower signal loss than conductive lines of a silicon interposer. This may reduce the complexity of manufacturing conductive lines 250 to route signals between the host device 205 and the memory device 210—e.g., this may reduce the usage of fan out packaging (FOP) in the operation layer 225 that other solutions may use. In some examples, the substrate 220 may be manufactured with a line parameter, space parameter, and a pitch less than the respective line parameter, space parameter, and pitch of the substrate 215. For example, the line parameter, space parameter, and pitch of the substrate 220 may be less than or equal to two (2) μm.

Memory device 210 may be configured to store data or information for host device 205—e.g., the host device 205 may write data to or read data from the memory device 210. In some examples, the memory device 210 may include an operation layer 225. For example, the operation layer 225 may be an example of a built-in self-test (BIST) layer. The operation layer 225 may be configured to provide one or more circuits to operate the memory device 210. For example, the operation layer 225 may include one or more self-test circuits to test aspects of the memory device 210. In some examples, the operation layer 225 may not have buffers. That is, because the system 200 utilizes a point-to-point connection, the operation layer 225 may not have drivers and receivers configured to receive signals from the host device 205, a buffer, and additional drivers configured to receive signals from the memory device 210. By utilizing a point-to-point connection and not buffering signals, the system 200 may reduce power consumption.

The memory device 210 may also include one or more memory layers 230. In some instances, the memory layers 230 may be manufactured on top of (e.g., stacked on top of) the operation layer 225. In some examples, the memory layers 230 may be examples of memory arrays (e.g., memory arrays 170 as described with reference to FIG. 1). In other examples, the memory layers 230 may be examples of memory dice (e.g., memory die 160 as described with reference to FIG. 165). In either example, the memory layers 230 may include a plurality of memory cells configured to store data. The memory layers 230 may be coupled with each other by TSVs 235 and bond pads. In some examples, the TSVs 235 may communicate data from the host device 205 and the interface 255 to a memory layer 230 by utilizing a non-perpendicular signal flow configuration (e.g., a waterfall configuration). For example, each memory layer 230 may include one or more column positions that are common to each memory layer 230. In some cases, the memory layer 230-b may be configured to route data from a TSV 235-a in a first column position to a TSV 235-b at a second column position down to the interface 255. The configuration of data transfer between the TSVs 235 in the waterfall configuration is described in additional detail with reference to FIG. 6.

In some examples, the memory device 210 is coupled with the substrate 220 by the interface 255. In some examples, the interface 255 may have a specific bump out or ball-out—e.g., the interface 255 may have a pattern of contacts configured to route the signals from the conductive lines 250. In some cases, the interface 255 may be configured to route the signals based on channels or routing patterns of I/O areas located in the memory device 210. The memory device 210 may include a plurality of I/O areas such that a distance between a memory cell in the memory device 210 and an I/O areas of the plurality of I/O areas is relatively small. By having the relatively small distance between the memory cell and the I/O areas, the memory device 210 may reduce power consumption associated with driving data between the I/O areas and the memory cell. Additional details related to the I/O areas and the ball-out or bump-out (e.g., the pattern) are described with reference to FIGS. 3-5.

Figure 3:
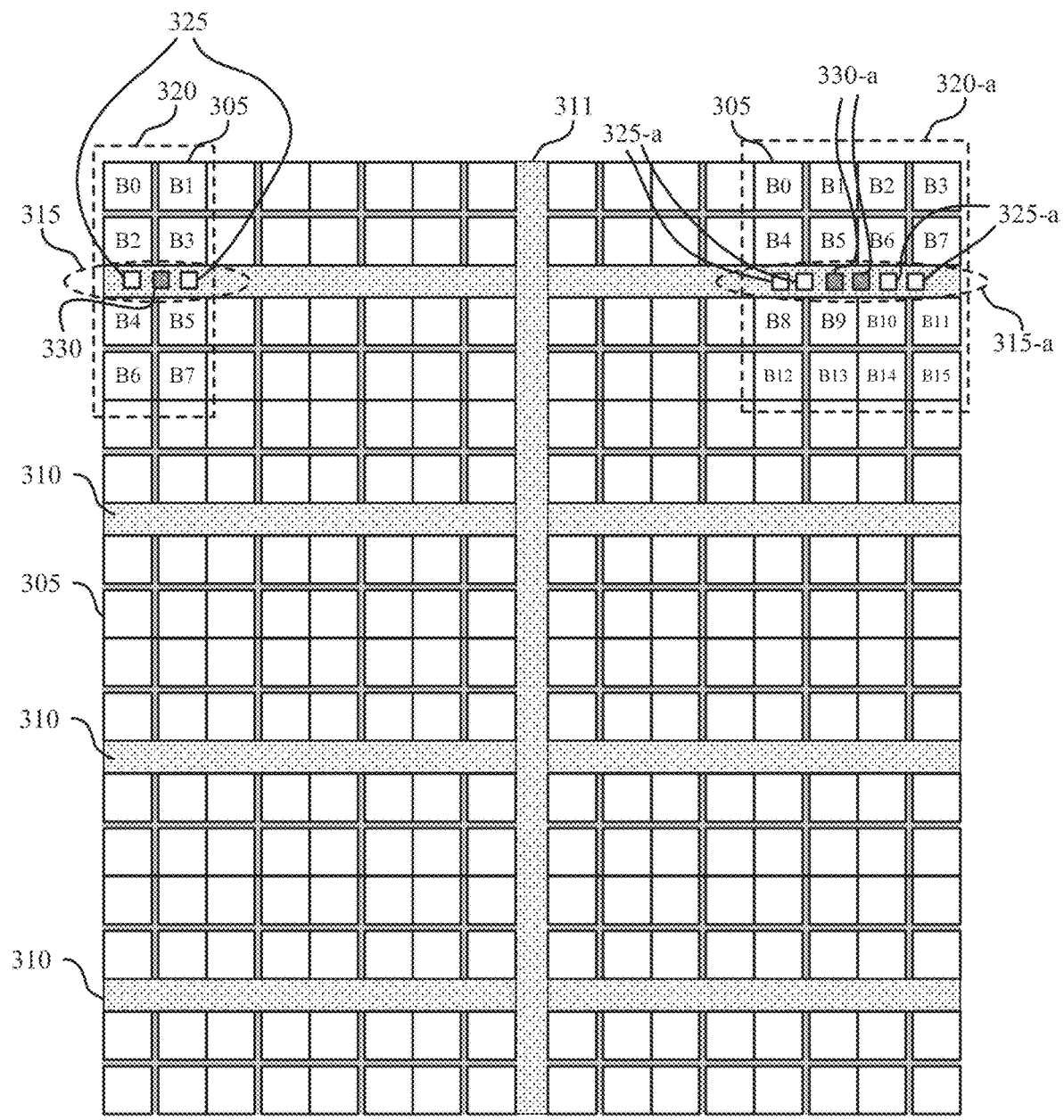
FIG. 3 illustrates an example of a memory array that supports memory with fine grain architectures in accordance with examples as disclosed herein.

FIG. 3 illustrates an example of a memory array 300 that supports memory with fine grain architectures in accordance with examples as disclosed herein. The memory array 300 may be an example of a memory die 160 described with reference to FIG. 1. In some cases, the memory array 300 may be referred to as a memory die, an array of memory cells, a deck of memory cells, or a memory layer 230 described with reference to FIG. 2. The various components of the memory array 300 may be configured to facilitate high bandwidth data transfer between a host device (e.g., host device 105 as described with reference to FIG. 1) and a memory device (e.g., memory device 210 as described with reference to FIG. 2) with which the memory array 300 is associated.

The memory array 300 may include a plurality of banks 305 of memory cells (as represented by the white boxes), a plurality of input/output (I/O) areas 310 (sometimes referred to as I/O stripes or I/O regions) traversing the memory cells of the memory array 300, and a plurality of data channels 315 that couple the memory array 300 with the host device. In some examples, the plurality of data channels 315 may route through a first organic substrate (e.g., substrate 220 as described with reference to FIG. 2). The data channels 315 may provide a point-to-point connection between the memory array 300 and the host device—e.g., there may be no buffering of signals communicated between the memory array 300 and the host device. Additionally or alternatively, the host device may directly send the signals to memory array 300 in using the point-to-point connection to read data from or write data to a memory cell of the memory array 300. In some examples, there may be a first I/O area 311 that extends in a first direction and there may be one or more I/O areas 310 that extend in a second direction of different than the first direction. In some cases, the first direction is orthogonal to the second direction. The I/O areas 311 and 310 may be devoid of memory cells and may be occupied with TSVs and/or other conductive paths used to route signals. For example, the I/O areas 310 and 311 may include conductive paths for power, for ground, for DQ channels, for CA channels, and other channels as described in FIG. 4 and other figures. Additional details about layouts of conductive paths in the I/O areas 310 and 311 are described in more detail with reference to FIG. 5.

Each of the banks 305 of memory cells may include a plurality of memory cells configured to store data. The memory cells may be DRAM memory cells, FeRAM memory cells, or other types of memory cells. At least some, if not each, of the plurality of I/O areas 310 may include a plurality of power pins and ground pins configured to couple the memory cells of the memory array 300 with power and ground. In some examples, the plurality of ground pins and power pins may be examples of the ground pins and power pins as described with reference to FIG. 2 (e.g., the pins 245). The ground and power pins may be supplied by a voltage provided by a second organic substrate (e.g., substrate 215 as described with reference to FIG. 2).

The memory array 300 may be divided into cell regions 320 associated with different data channels 315. For example, a single data channel 315 may be configured to couple a single cell region 320 with the host device. The pins of the I/O channel may be configured to couple multiple cell regions 320 of the memory array 300 to power, ground, virtual ground, and/or other supporting components.

To provide a high throughput of data (e.g., multiple TB/s) between a host device (not shown) and the memory array 300, a path length between any given memory cell and the host interface may be shortened, as compared to previous solutions. In addition, shortening the data path between any given memory cell and the host device may also reduce the power consumed during an access operation (e.g., read operation or write operation) of that given memory cell. Different architectures and/or strategies may be employed to reduce the size of the data path. For example, the memory array 300 may be coupled with the first substrate through a plurality of interfaces, each interface including multiple I/O channels and areas. This may reduce the distance between a given memory cell and the I/O channels. In such cases, the memory array 300 may reduce power consumption with the shorter distance between the memory cell and the I/O channels as compared with other solutions. The memory array 300 may also perform faster accesses (e.g., read, write, or refresh accesses) on the memory cells given the distance is reduced.

In some examples, the memory array 300 may be partitioned into a plurality of cell regions 320. Each cell region 320 may be associated with a data channel 315. Two different types of cell region 320 are illustrated, as one example, but the entire memory array 300 may be populated with any quantity of cell regions 320 having any shape. A cell region 320 may include a plurality of banks 305 of memory cells. There may be any quantity of banks 305 in a cell region 320. For example, the memory array 300 illustrates a first cell region 320 that may include eight banks 305 and a second cell region 320-a that may include sixteen banks 305-a.

Other quantities of banks in the cell region are possible, however (e.g., two, three, four, five, six, seven, eight, nine, ten, eleven, twelve, thirteen, fourteen, fifteen, sixteen, seventeen, eighteen, nineteen, twenty, twenty-one, twenty-two, twenty-three, twenty-four, twenty-five, twenty-six, twenty-seven, twenty-eight, twenty-nine, thirty, thirty-one, thirty-two, etc.). The size of the cell region 320 may be selected based on the bandwidth constraints of the host device, the power usage of the host device or the memory device, the size of the data channel, the parameters of the substrate used to couple the memory array 300 with the host device, a data rate associated with the data channel, other considerations, or any combination thereof. In some cases, the memory array 300 may be partitioned such that each cell region 320 may be the same size. In other cases, the memory array 300 may be partitioned such that the memory array 300 may have cell regions 320 of different sizes.

A data channel 315 (associated with a cell region) may include a quantity of pins for coupling the memory cells of the cell region 320 with the host device. At least a portion of the data channel 315 may comprise channels of the substrate (e.g., the first organic substrate). The data channel 315 may include a data width specifying how many data pins 325 (sometimes referenced as DQ pins) are in the data channel 315. For example, a data channel may have a channel width of two data pins (e.g., X2 channel), four data pins (e.g., X4 channel), eight data pins (e.g., X8 channel), sixteen data pins (e.g., X16 channel), etc. The data channel may also include at least one CA pin 330 (sometimes referred to as a C/A pin). Each memory cell in the cell region 320 may be configured to transfer data to and from the host device using the data pins 325 and CA pins 330 associated with the cell region 320. The data channel 315 may also include a clock pin (e.g., CLK or WCLK) and/or a read clock pin or a return clock pin (RCLK).

In some cases, the channel width of the data channel 315 may vary based on the parameters of the substrate (e.g., the organic substrate) used to couple the memory device and the host device. For example, if a first substrate (the fine pitch organic substrate) having a first line and space parameter is used to couple the memory device and the host device, then the channel width may be a first width. In another example, however, if a different substrate (e.g., an organic substrate with a different line and space parameter or pitch) is used to couple the memory device and the host device, then the channel width may be second width. An I/O interface (not shown in FIG. 3) of the memory array 300 may be configured to support both channel widths. That is, the I/O interface may have a pattern of routes to communicate data to and from the memory device. In some examples, the first substrate is coupled with the memory device through interfaces that mirror the pattern of the I/O interface. In some instances, to maintain data bandwidth, data throughput, or data accessibility, different modulation schemes may be used to communicate data across channels with different widths. For example, PAM4 may be used to modulate signals communicated across an X4 channel and NRZ may be used to modulate signals communicated across an X8 channel.

The I/O area 310 (e.g., the I/O stripe) may, in some cases, bisect the banks 305 of memory cells in the cell region 320. In this manner, the data path for any individual memory cell may be shortened. That is, with a plurality of I/O areas 310, the distance data is driven between the memory cell and the I/O area may be reduced. The I/O areas 310 may be dispersed across the memory array 300 strategically to reduce the distances.

Figure 4:
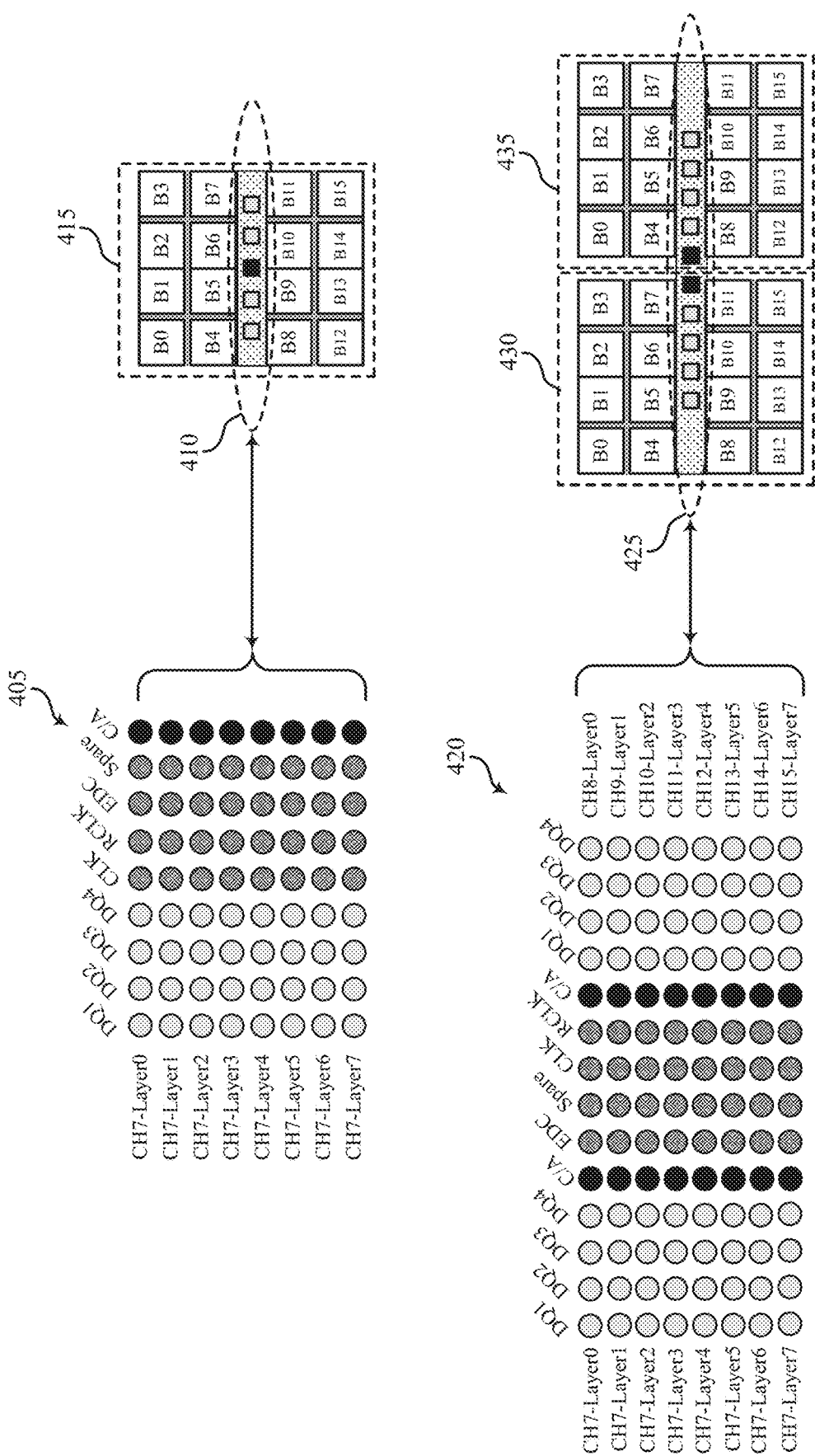
FIG. 4 illustrates an example of a data channel configuration that supports memory with fine grain architectures in accordance with examples as disclosed herein.

FIG. 4 illustrates an example of a data channel configuration 400 that supports memory with fine grain architectures in accordance with examples as disclosed herein. For example, a first data channel configuration 405 illustrates an independent data channel 410 that services a first cell region 415. A second data channel configuration 420 illustrates a data channel pair 425 where data channels for two cell regions (e.g., second cell region 430 and third cell region 435) share clock pins, error detection code (EDC) pins, and spare pins. In some cases, the channel width of the data channel configurations may be adjustable based at least in part on a parameter associated with a first substrate (e.g., a substrate 220 as described with reference to FIG. 2) used to couple a host device (e.g., host device 105 as described with reference to FIG. 1) with a memory device (e.g., memory device 210 as described with reference to FIG. 2). For example, if an organic substrate has a first line and space parameter, the data channel may have a first channel width, and, if the organic substrate has a second line and space parameter, the data channel may have a second channel width that is larger than the first channel width (e.g., twice as big).

The data channel 410 illustrates a data channel for a stacked memory device that includes eight layers that has a channel width of four (e.g., there are four data pins). In other examples, the channel width may be more than four or less than four (e.g., eight data pins). Each row of pins in the data channel 410 may be associated with a cell region in a separate layer. The first cell region 415 illustrates a cell region of a single layer. As such, the first cell region 415 may be associated with a single row of the pins of the data channel 410. The quantity of pins in a data channel may be based on the quantity of layers in the memory device because a single data channel may be configured to couple with a given layer.

In some cases, the term data channel may refer to pins associated with a single cell region of a single layer. The term data channel may refer to pins associated with multiple cell regions across multiple layers. In some examples, data channels may be coupled with a single cell region (e.g., without being coupled with another cell region) of any given layer or memory die. The same may also be true for the data channel pair 425 of the second data channel configuration 420. The data channel pair 425 shows pins for cell regions across multiple layers of the memory device. Although data channel 410 and data channel pair 425 shown may be associated with cell regions in eight layers, any quantity of layers are possible. For example, the data channel 410 and data channel pair 425 may be associated with cell regions in one, two, three, four, five, six, seven, eight, nine, ten, eleven, twelve, thirteen, fourteen, fifteen, or sixteen (or more) layers of the memory device.

The data channel 410 includes four data pins (DQ0-DQ4), a clock pin (CLK or a WCLK signal), a read clock pin or return clock pin (RCLK), and a command/address pin (CA). The data channel 410 may also include an EDC pin and a spare pin that is utilized when another pin is defective. In other cases, the data channel may have a different rank or different channel width. In such situations, the quantity of data pins may be different. For example, the data channel 410 may have a channel width of eight and may include eight data pins. Any quantity of data pins associated with a region are contemplated by this disclosure. The data channel 410 may include any quantity of C/A pins. For example, the data channel 410 may include one, two, three, or four C/A pins. In some cases, the data channel 410 may include an error correction code (ECC) pin (not shown) for facilitating error detection and correction procedures. The data channel 410 may also include a data bus inversion (DBI) pin (not shown) for limiting the quantity of simultaneous transitioning signals and bias the state of the transmitted data towards a preferred level.

The data channel pair 425 may be similarly embodied as the data channel 410 except that two data channels associated with two different cell regions may be configured to share clock pins, EDC pins, and spare pins. As such, in the data channel pair 425, the clock pins (e.g., CLK, RCLK, or WCK), EDC pins, and spare pins may be coupled with two cell regions of the same layer of the memory device, while the other pins of the data channel pair 425 (e.g., DQ pins, C/A pins, ECC pins) may be coupled with a single cell region of a single layer. For example, the illustrated data channel pair 425 may have a width of four. As such, four data pins and one C/A pin (e.g., CH0-Layer0) may be coupled with the second cell region 430 and four data pins and one C/A pin (CH8-Layer0) may be coupled with the third cell region 435.

The data channel pair 425 may reduce the complexity of a memory device and the power consumption of the memory device. For example, by sending a single set of clock signals to two cell regions in a layer, it may reduce the quantity of clock components in the memory device and thereby reduce the amount of power to drive the clock signals. In some examples, the second cell region 430 and the third cell region 435 may share the spare pin. In such examples, the second cell region 430 and the third cell region 435 may share a logic (e.g., a multiplexer (MUX)) that is configured to communicate with either the second cell region 430 or the third cell region 435 depending on which cell region is utilizing the spare pin at a given time—e.g., the MUX may communicate with the second cell region 430 when the second cell region is utilizing the spare pin.

In some cases, the channel widths of the data channels may be configurable based on parameters of the substrate used to couple the host device and the memory device and/or the type of modulation scheme used to modulate signals communicated between the host device and the memory device. Different substrates (e.g., the fine pitch organic substrate) with different parameters may be able to support different signal frequencies.

The memory device may be configured to couple with interfaces depending on the pattern utilized by the interface to route signals. For example, the terminuses of the channels 410 or 425 may be in a first pattern indicating the routing of the signals to different locations in the memory device. In such cases, the memory device may couple with an interface that has a second pattern of routing signals that is the same as the first pattern. That is, the memory device may be coupled with a fine pitch organic substrate that is manufactured with a bump-out or a ball-out pattern that is the same as the routing pattern in the channels 410 or 415 (e.g., the pattern of the I/O areas). Such a configuration may improve the compatibility between the memory device and the substrate (e.g., the fine pitch organic substrate). For example, the memory device coupling with interfaces with the same pattern may enable the memory device to have an increased quantity of channels 410 or 425 dispersed throughout the memory device. In such examples, the distance between the memory cells and the channels 410 or 425 may be reduced. That is, the average distance data has to be driven between a memory cell and a channel 410 or 425 may be reduced compared with previous solutions. The memory device may consume less power and increase a rate of data transfer to and from the host device through the fine pitch organic substrate—e.g., the shorter average distances enable decrease in a ratio of picojoules utilized while transferring a bit of data.

TABLE 1

| Solo Channel | Channel Pair |
|---|---|
| 8 DQ pins | 16 DQ pins (8 per region) |
| 1 DBI pin | 2 DBI pins (1 per region) |
| 1 ECC pin | 2 ECC pins (1 per region) |
| 1 CA pin | 2 CA pins (1 per region) |
| 1 WCK pin | 1 WCK pin (shared by regions) |
| 1 RCK pin | 1 RCK pin (shared by regions) |
| 1 EDC pin | 1 EDC pin (shared by regions) |
| 1 spare pin | 1 spare pin (shared by regions) |

Table 1 provides two examples of channel layouts, a first example showing a channel that supports one region of memory cells and a second example showing a second channel that supports two regions of memory cells. The second example may be an example of a channel pair where some pins or signals are shared by both regions of memory cells and some pins or signals are dedicated to a certain memory region. If a memory device includes 8 regions of memory cells per memory layer and has a stack that is eight memory layers high, there may be a total of 64 regions of memory cells in the memory device. In the first example of a solo channel such a configuration may result in 1920 total pins or conductive paths in the memory device. In the second example of a shared channel such a configuration may result in total pins or conductive in the memory device. Thus, the channel pair example may result in fewer conductive paths between the host device and the memory device. In some cases, it may be advantageous to be below certain pin counts to increase compatibly with some host devices or interfaces. Examples of conductive pin quantity thresholds may include 1,704 conductive paths or 1,624 conductive paths.

Figure 5:
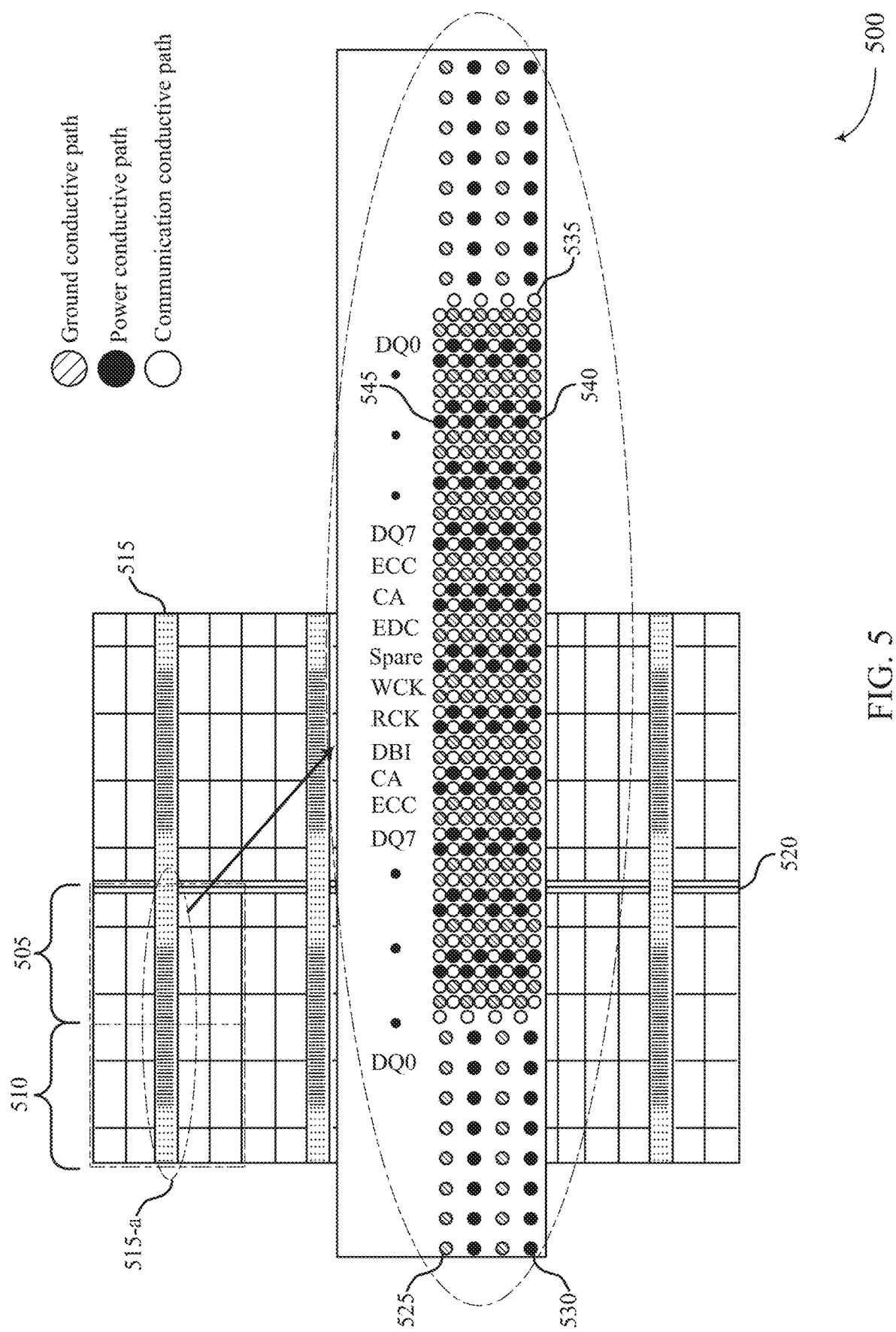
FIG. 5 illustrates an example of a memory array that supports memory with fine grain architectures in accordance with examples as disclosed herein.

FIG. 5 illustrates an example of a memory array 500 that supports memory with fine grain architectures in accordance with examples as disclosed herein. The memory array 500 may be an example of the memory array 170 as described with reference to FIG. 2 or the memory array 300 described with reference to FIG. 3. The memory array 500 may illustrate an example of a physical layout of the conductive paths within an I/O area while the memory array 300 may illustrate a more simplified version of the conductive paths with an I/O area. The memory array 500 may be an example of a memory layer 230 of a memory device as described with reference to FIG. 2. The memory array 500 may include an I/O area (e.g., channels, stripes, or interfaces) 520 and I/O areas 515. The I/O areas 515 and 520 may occupy areas of memory array 500 that are devoid of memory cells. In some examples, memory array 500 may also be referred to as memory die.

In some cases, the memory array 500 may be coupled with a fine pitch organic substrate (e.g., substrate 220 as described with reference to FIG. 2). That is, the memory array 500 may receive signals directly from a host device (e.g., host device 105 as described with reference to FIG. 1) through the fine pitch organic substrate via conductive lines (e.g., conductive lines 250 as described with reference to FIG. 2). The memory array 500 may be coupled with the fine pitch organic substrate by a first interface (e.g., interface 255 as described with reference to FIG. 2). The first interface may have bump-out or ball-out pattern that contacts the memory array 500. The first interface pattern may be configured to route signals to different regions of the memory array 500. In some examples, the pattern contacts may be positioned below an I/O area 515. That is, the pattern of contacts may be based on the layout (e.g., floorplan) of the I/O area 515 to route signals from the host device to the memory cells in the memory array 500. By having the I/O area 515 routing patterns match the bump-out or ball-out of the interfaces, the compatibility between the memory array and the fine pitch organic substrate may be increased.

In some examples, a memory array 500 may include a plurality of regions of memory cells. In some cases, each region of the plurality of regions of memory cells may include one or more banks of memory cells (e.g., portions of memory cells). The memory array 500 may include multiple I/O areas 515 and 520 that are distributed (e.g., dispersed) throughout the memory array 500 such that the memory cells are located relativity near the I/O areas 515 and 520. For example, the memory array 500 may include an I/O area 520 that extends through the memory array 500 vertically. The vertical I/O area 520 may divide the memory array 500 into a first portion and a second portion of memory cells.

In some examples, the memory array 500 may include multiple I/O areas 515 that extend in a horizontal direction through the memory array 500. The horizontal I/O area 515 may extend through both the first portion and the second portion of memory cells. The portion of the horizontal I/O area 515 that extends through the first portion (e.g., I/O area 515-*a*) may include a plurality of channels. For example, the I/O area 515-*a* may include a first plurality of channels (e.g., TSVs 235 or pins 245 as described with reference to FIG. 2) configured to communicate with an area of memory cells 505 and a second plurality of channels to communicate with an area of memory cells 510. In some examples, the area of memory cells 505 and 510 may be each be examples of a bank of memory cells. In some example, the first plurality of channels and the second plurality of channels may share common channels (e.g., as described with reference to FIG. 4). That is, rather than having a single plurality of channels dedicated exclusively for area of memory cells 505 and 510, the first plurality and second plurality of channels may share channels. This may reduce the overall quantity of signals communicated and channels utilized throughout the memory die—e.g., by sharing channels, the total signals utilized may decrease. For example, channels communicating clock signals (e.g., WCK, RCK, or CLK (not shown)) and error detection code (e.g., EDC) signals may be shared. Additionally, the first plurality of channels and the second plurality of channels may also share a spare channel. In some examples, the spare channel may share a common logic (e.g., a multiplexer (MUX)) such that the logic is configured to communicate with either the first plurality of channels or the second plurality of channels depending on which plurality is utilizing the spare channel at a given time. The remaining channels (e.g., channels DQ0-DQ7, ECC, CA, and data bus inversion (e.g., DBI)) may be dedicated exclusively to an area of memory cells—e.g., a set of the channels described (DQ0-DQ7, ECC, CA, and DBI) may be exclusive to the area of memory cells 505.

The plurality of channels may be configured to communicate various types of signals to and from the memory array 500. For example, some channels the plurality of channels may be configured to communicate a ground signal 525 (e.g., a ground voltage) and some channels of the plurality of channels may be configured to communicate a power signal 530 (e.g., a voltage). The signals 525 and 530 may originate from an organic substrate (e.g., substrate 215 as described with reference to FIG. 2). In some examples, the ground signal 525 may be referred to as a ground channel, a ground signal path, or a ground conductive path and the power signal 530 may be referred to as a power channel, a power signal, or a power conductive path. In some examples, some channels of the plurality of channels may be configured to communicate communication signals 535 between the host device and memory device. The signals 535 may be routed through a second organic substrate with a fine pitch (e.g., substrate 220 as described with reference to FIG. 2). In some examples, the communication signals 535 may be referred to as communication channels, communication signal paths, or communication conductive paths. Examples of the communication signals 535 may include DQ signals, CA signals, DBI signals, ECC signals, EDC signals, WCK signals, and RCK signals, among other signals.

In some examples, each row of the plurality of channels (e.g., the row of channels for the DQ0 pin) may communicate signals for different layers (e.g., memory layers 230 as described with reference to FIG. 2) in the memory device. For example, the channel communicating signal 540 may be a channel communicating with a first layer (e.g., memory layer 230-*a*) while the channel communicating signal 545 may be a channel communicating with an eighth layer (e.g., memory layer 230-*h*). In such examples, the channels communicating the signals between signal 540 and 545 may communicate with a layer between the first layer and the eighth layer (e.g., memory layers 230-*b* through memory layers 230-*g*). In some examples, because of the non-perpendicular data flow structure, the top-most channel remains dedicated to that particular level (e.g., the channel communicating signal 545 may remain dedicated to the eighth layer, even if the channel extends through the remaining layers). Further details of the non-perpendicular data flow structure (e.g., waterfall structure) and arrangement of channels throughout the layers is described with reference to FIG. 6.

The memory array 500 may be coupled with the fine pitch organic substrate through multiple interfaces—e.g., there may be multiple vertical I/O areas 520 distributed throughout the memory array 500. Additionally, there may be multiple I/O areas 515 dispersed throughout the memory array 500. This may enable the memory array 500 to have multiple connection points with the host device, decreasing the distance data has to be driven to or from a memory cell based on a received signal. That is, in some memory devices there may be a centralized interface that communicates some or all of the data from the memory cell. In such examples, data routed from distant memory cells (e.g., memory cells far from the interface) may be driven relatively far increasing the power consumption and reducing the rate of transfer (e.g., it may take additional power and time to drive the data from the distant memory cell to the centralized interface). As described herein, with multiple interfaces and I/O areas distributed throughout the memory array 500, the distance data is driven/routed from a given memory cell to the interface may be relatively small. That is, with a dedicated first plurality of channels for the area of memory cells 505, data may be quickly driven from the memory cell to the I/O area 515 as the distance is relatively small. For example, the memory cell may be coupled with a first conductive line coupling the memory cell with the I/O area 515. Then the I/O area 515 may communicate signals to the interface between the memory array 500 and the host device. The conductive lines in the fine pitch organic substrate may then transfer the data between the interface and the host device. The decreased distances may decrease power consumption and increase a rate of data transfer for the memory array 500.

Figure 6:
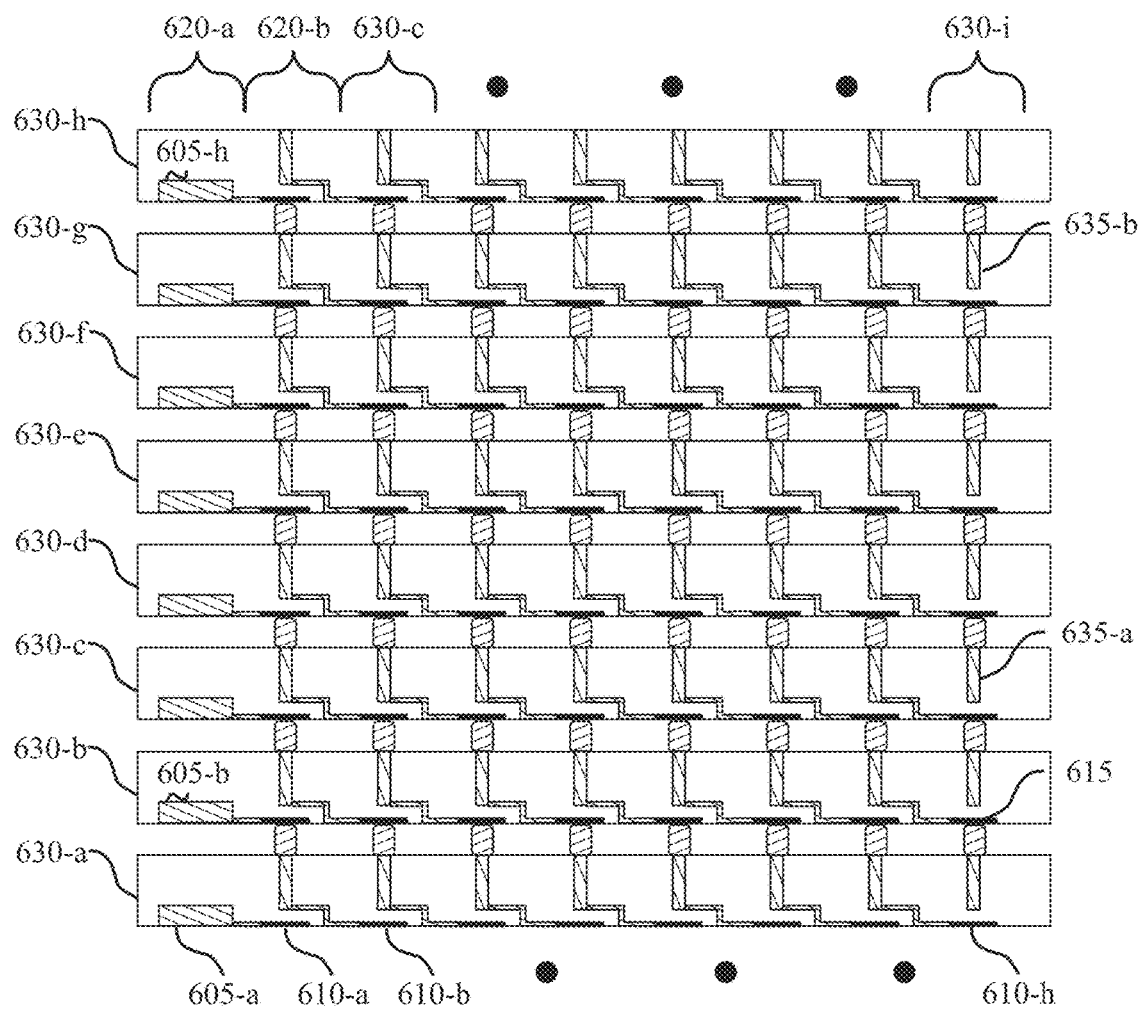
FIG. 6 illustrates an example of a memory device that supports memory with fine grain architectures in accordance with examples as disclosed herein.

FIG. 6 illustrates an example of a memory device 600 that supports memory with fine grain architectures in accordance with examples as disclosed herein. Memory device 600 may be an example of memory device 210 as described with reference to FIG. 2. The memory device 600 may include memory layers 630 (e.g., memory layers 230 as described with reference to FIG. 2). The memory device 600 may also include TSVs 635 and bond pads 615 coupling the conductive path between the TSVs 635. Each memory layer 630 may also include an I/O circuit 605.

In some examples, each memory layer 630 may be configured to store data for a host device (e.g., a host device 105 as described in FIG. 1). Data may be communicated to and from the memory layers 630 by an I/O circuit 605 and TSVs 635. That is, each memory layer 630 may have a region of memory cells coupled with an I/O circuit 605. The I/O circuit 605 may communicate data to and from the region of memory cells. Each I/O circuit 605 may include drivers, receivers, and other logic to communicate with the host device—e.g., the I/O circuit 605 may utilize drivers to drive data to the host device and utilize receivers to receive data from the host device. Because the memory device 600 is coupled with the host device by a point-to-point connection, the I/O circuit 605 does not contain any buffers and communicates directly with the host device. That is, the host device may transmit a signal directly to the I/O circuit 605 to communicate with a memory cell.

In some examples, each I/O circuit 605 may also be coupled with a DQ pin 610 for a given memory layer 630. For example, the I/O circuit 605-*a* may be coupled with a DQ0 pin 610-*a* for the memory layer 630-*a* while I/O circuit 605-*h* may be coupled with a DQ0 pin 610-*h* for the memory layer 630-*h*. The DQ pin 610 may be coupled with additional TSVs 635 that lead to conductive lines in a fine pitch organic substrate (e.g., substrate 220 as described with reference to FIG. 2) that couples the memory device 600 with the host device. In some examples, the I/O circuits 605 may reside in a first column position 620-*a*. That is, each I/O circuit 605 of a given memory layer 630 may be in the same column position 620-*a*.

In some examples, the I/O circuits 605 may drive and receive data or signals through the TSVs 635. The I/O circuits may drive and receive the signals and data in non-perpendicular (e.g., a waterfall) signal flow structure. For example, the I/O circuit 605-*a* may drive signals to the DQ pin 610-*a* in a second column position 620-*b*. The I/O circuit 605-*b* for the memory layer 630-*b* may drive a signal to a first TSV 635 in the second column position 620-*b* extending through the memory layer 630-*a*—e.g., the first TSV 635 in the second column position 620-*b* extending through the memory layer 630-*a* may be coupled with an output of memory layer 630-*b* by a bond pad 615. The signal may then be driven from the first TSV 635 in the second column position 620-*b* to the DQ pin 610-*b* in the third column position 620-*c*. A similar method of signal and/or data transfer may be implemented at each I/O circuit 605. For example, the I/O circuit 605-*h* located in the first column position 620-*a* may eventually drive the signal to the DQ pin 610-*h* in the ninth column position 620-*i* along the TSVs 635—e.g., starting by driving the signal to a second TSV 635 in the second column position 620-*b* extending through the memory layer 630-*g*, then to a third TSV 635 in the third column position 620-*c* extending through the memory layer 630-*f*, so forth until the signal is driven to the DQ pin 610-*h*. Thus, although the second TSV 635 is located in the second column position 620-*b* above the DQ pin 610-*a*, the second TSV 625 may be dedicated to the memory layer 630-*h* and the DQ pin 610-*h*. The I/O circuits 605 may receive signals from the host device along the same TSV 635 path the signals are driven.

In some examples, the TSVS 635 not in the paths to the DQ pin 610 may remain inactive. For example, TSV 635-*b* may remain inactive while signals and data are being driven. That is, the TSV 635-*b* is out of any data or signal path to a given DQ pin 610 and may thus remain inactive.

By utilizing the waterfall structure for the signal and data paths through the TSVs, the manufacturing of memory device 600 may be simplified. That is, each I/O circuit 605 and TSV may be manufactured in the same column position 620 while still being configured to drive different I/O circuits 605 to different DQ pins 610 at different column positions 620.

Figure 7:
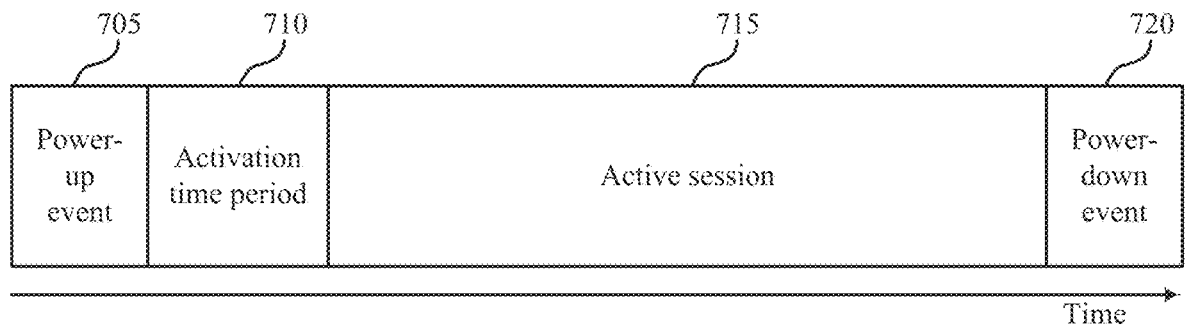
FIG. 7 illustrates an example of a timeline that supports memory with fine grain architectures in accordance with examples as disclosed herein.

FIG. 7 illustrates an example of a timeline 700 that supports memory with fine grain architectures in accordance with examples as disclosed herein. The timeline 700 shows events that may occur at a memory device (e.g., a memory device 210 as described with reference to FIG. 2). The timeline 700 indicates a timing for performing a training procedure and/or a frame synchronization procedure. During an active session 715, the memory device may be configured to identify the beginning of a frame based on a frame clock without reinitializing a frame training procedure.

The timeline 700 may include a power-up event 705, an activation time period 710, an active session 715, and a power-down event 720. When the memory device is powered down (e.g., after a power-down event 720), the memory device may be communicating little to no information with a host device (e.g., host device 105 as described with reference to FIG. 1). As such, frame synchronization may not be utilized at that time. A power-up event 705, is any event where the memory device begins an active session 715. A power-up event 705 may be transition from an off-state to an active state or from a low-power state to the active state. The active session 715 may refer to a period of time when the memory device is servicing the memory needs of a host device—e.g., performing access operations. The active session 715 may refer to a continuous period of time where the memory device is operating without interruption (e.g., without powering down in any way).

Before beginning the active session 715, the memory device may have to initialize a number of parameters to provide full functionality to the host device. The memory device may initialize these parameters during the activation time period 710. During the activation time period 710, the memory device may initiate a number of procedures to bring functionality to the memory device. For example, during the activation time period 710, the memory device may initiate an eye synchronization procedure, a frame training procedure, a frame synchronization procedure, and/or other procedures, or a combination thereof.

During the activation time period 710, the memory device may receive a clock of the host device and may determine a rising or falling edge of a symbol. Once the memory device has identified a correct timing for the symbols received from the host device, the memory device may initialize a frame training procedure during the activation time period 710. That is, the memory device may synchronize a clock of the memory device with the clock of the host device. In some examples, the clock of the host may be associated with a specific channel (e.g., channels 115 as described with reference to FIG. 1). For example, the memory device may initiate a synchronization procedure for a clock of the host device associated with the C/A channel. In such examples, synchronizing the memory clock associated with the CA channel with the host clock associated with the CA channel may help facilitate a point-to-point connection between the memory device and the host device. That is, because the memory device does not include any buffer layers (and does not buffer any signals), the host device may transmit signals directly to memory arrays (e.g., memory array 170 as described with reference to FIG. 1) and memory cells. The synchronization procedure may improve the efficiency of such point-to-point connections.

After the activation time period 710 and the synchronization procedure, the host device may communicate commands to the memory device during the active session 715—e.g., commands to read data from or write data to the memory cells of the memory device. The memory device may perform the operation associated with the command during the active session 715 based on receiving the command. In some examples, after executing the command, the memory device may experience another power-down event 720 and power down. That is, the memory device may cycle through the timeline 700 over time as the host device services the memory device. In some examples, the host device may initiate the power down—e.g., the power-down event 720 may be a command from the host device. In other examples, the power-down may occur after a defined time period of inactivity—e.g., after a duration during which the host device does not transmit command to the memory device.

To reduce the quantity of conductive paths between the host device and a memory device a frame structure for communicating data and commands may be used. In some memory systems, a conductive path may be dedicated to a signal that informs the memory device when a command is being transmitted. In such examples, the memory device may ignore data on certain conductive paths when the enable signal is active. If the enable conductive path, the memory device may use a different mechanism to synchronize when commands are being transmitted. In such examples, a packetized frame structure may be used. In such a structure, a frame timing (or packet timing) may be synchronized between the host device and memory device then information may be communicated in frames (e.g., packets). In such examples, the information may not use headers or an enable signal thereby reducing signaling overhead and reducing a quantity of conductive paths.

Figure 8:
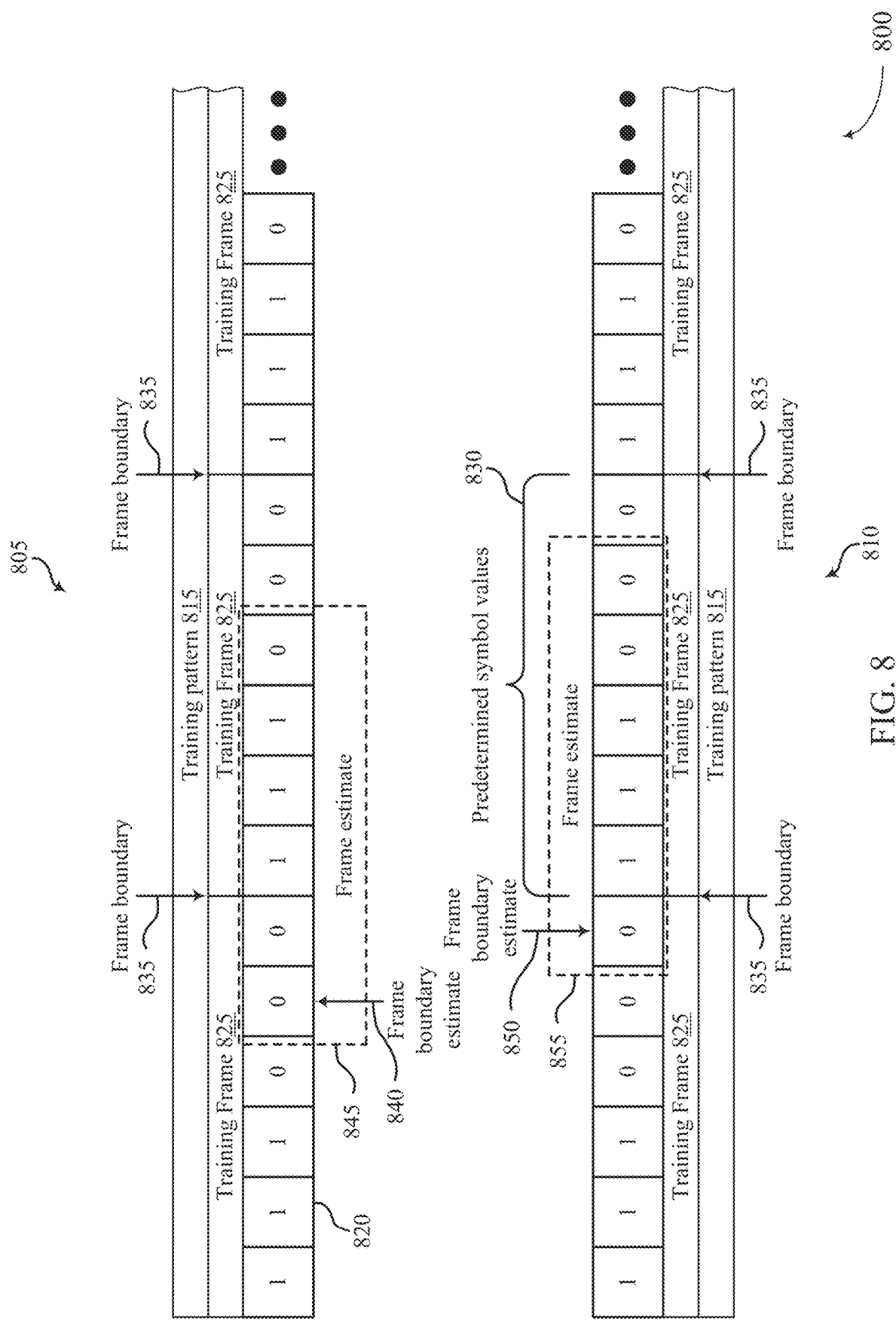
FIG. 8 illustrates an example of a structure that supports memory with fine grain architectures in accordance with examples as disclosed herein.

FIG. 8 illustrates an example of a structure 800 for a frame training procedure that supports memory with fine grain architectures in accordance with examples as disclosed herein. The structure 800 shows two instances (e.g., first instance 805 and second instances 810) of a training pattern 815. Each instance 805, 810 shows a step in the frame training procedure.

The frame training procedure is a process by which a memory device (e.g., a memory device 110 as described with reference to FIG. 1) identifies a correct frame boundary. With the frame boundary, the memory device may generate a frame clock, which is used to identify frame boundaries (i.e., the start and stop of a frame) during an entire active session. The frame clock may be based on a system clock, a symbol length, and a frame length. In some cases, the frame clock is a virtual clock that relies on the system clock for its timing. In other cases, the frame clock is a physical clock that is initialized to track the frames.

The training pattern 815 comprises a long train of symbols 820 that are set to predetermined symbol values used to identify a frame boundary. The training pattern 815 may comprise a plurality of training frames 825, each training frame 825 comprising an ordered set of predetermined symbol values 830. An example of the symbol values may be a set of logic '1's followed by a set of logic '0's, or vice versa. The training frame 825 may have a frame length that is equal to a frame length of the frames transmitted by a host device (e.g., a host device 105 as described with reference to FIG. 1) during the active session through a fine pitch organic substrate (e.g., substrate 220 as described with reference to FIG. 1). That is, a portion of the channel communicating information between the host device and the memory device may be routed through a conductive line (e.g., conductive lines 250 as described with reference to FIG. 2) in the fine pitch organic substrate. Using a plurality of training frames, the memory device may be configured to determine a frame boundary 835 and generate a frame clock that is used to identify the beginning of frames (or the end as the case may be) during the active session. That is, the memory device may be configured to synchronize a clock of host device associated with CA channel (e.g., channel 186 as described with reference to FIG. 1) with a clock of the memory device associated with the CA channel. In some examples, the CA channel may be the conductive line routed through the fine pitch organic substrate (e.g., conductive lines 250 as described with reference to FIG. 2). Additionally, the fine pitch organic substrate may be coupled with an organic substrate (e.g., substrate 215 as described with reference to FIG. 2).

During the activation time period and as part of a frame training procedure, a host device may transmit a message to the memory device. In some examples, the host device may include the training pattern 815 to the memory device in the message. The memory device may determine when the training pattern is being transmitted so that it may be ready to initialize the frame training procedure.

The host device may transmit the message to include an ordered set of symbols of a training frame of the training pattern that the memory device may identify. Additionally, the training pattern may include a set of training frames that each comprise an ordered set of symbol values. As shown in the first instance, 805, upon receiving the training pattern 815, the memory device may identify a symbol of the training pattern as a first frame boundary estimate 840. Using the first frame boundary estimate and/or a known frame length, the memory device may generate a first frame estimate 845. The first frame estimate 845 may include a number of symbols of the training pattern 815 equal to the frame length of a training frame 825. The memory device may identify the ordered set of symbols of the first frame estimate 845. The memory device may compare the ordered set of symbols of the first frame estimate 845 to the ordered set of predetermined symbol values 830.

If the ordered set of symbols of the first frame estimate 845 matches the ordered set of predetermined symbol values 830, the memory device may identify the rising edge of the symbol that comprises the first frame boundary estimate 840 as the frame boundary. If the sets do not match, the memory device may perform a second frame boundary estimate 850 and a second frame estimate 855 as shown in the second instance 810. The memory device may then repeat the same process of comparing the set of symbol values in the second frame estimate 855 to the ordered set of predetermined symbol values 830. This process may continue until a correct frame boundary is found.

In some cases, the difference between the first frame boundary estimate 840 and the second frame boundary estimate 850 may be one symbol. In such cases, the memory device may slip the boundary estimate one symbol upon determining that the frame boundary is not correct. In other cases, the memory device may select the second frame boundary estimate 850 based on a predetermined symbol distance (e.g., one, two, three, four, five, six symbols, etc.). In some cases, the memory device may select the second frame boundary estimate based on the ordered set of symbol values found in the first frame estimate 845. For example, if the memory device knows that the predetermined set of symbol values is 111000 and the set of symbol values of the first frame estimate 845 is 001110, the memory device may identify the third symbol of the first frame estimate 845 as the second frame boundary estimate 850.

Once the memory device identifies the correct frame boundary, the memory device may generate a frame clock based on the frame synchronization process. The frame clock may indicate the beginning of a new frame through the active session. Using the frame clock, the memory device and the host device may not use headers to indicate the location of frames, thereby freeing up more symbols for substantive data. In some cases, the frame boundary may be aligned with a rising edge of a first symbol (or a first symbol period) in the frame. As such, the frame clock may also be aligned with a rising edge of the symbol period of the frame.

After the synchronization process, the memory device may receive a command during a frame associated with the frame boundary identified by the memory device. The memory device may receive the command from the host device over the CA channel. In some examples, the frame may include a quantity of unit intervals—e.g., sixteen-unit intervals. The frame associated with the CA channel may have a different unit of intervals than a unit of intervals for a second frame associated with a data channel between the memory device and the host device. That is, the memory device may perform a separate synchronization process to find a frame boundary associated with the data channels. In some instances, the unit of intervals for frame associated with the data channel may be twice as large as the unit of intervals for the frame associated with the command packet—e.g., a 2:1 command to data packet ratio. For example, the data frame may contain 32 bytes of information at four (4) nanosecond data frames while the command frame may include 16 bits at two (2) nanosecond command frames.

In some instances, the frame boundaries associated with the CA channel may be the same for independent, shared, or concurrent CA channels. That is, the memory device may be coupled with a plurality of CA channels and the packetized protocol as described herein may be same across the plurality of CA channels, whether the channels are independent, concurrent, or shared.

In some examples, the following tables (e.g., Table 2 and Table 3) may illustrate the various command the memory device may receive from the host device during a given frame boundary. Table 2 may illustrate the information transmitted during the first eight (8) unit intervals while Table 3 may illustrate the information transmitted during the second eight (8) unit intervals of the frame boundary:

TABLE 2

| Command | UI0 | UI1 | UI2 | UI3 | UI4 | UI5 | UI6 | UI7 |
|---|---|---|---|---|---|---|---|---|
| NOP | L | L | L | V | V | V | V | V |
| ACT0 | H | L | L | BA3 | BA2 | BA1 | BA0 | V |
| ACT1 | H | L | H | V | V | V | V | V |
| REF | H | H | L | V | V | V | V | L |
| REFPB | H | H | L | BA3 | BA2 | BA1 | BA0 | H |
| MRS | H | H | H | M3 | M2 | M1 | M0 | OP7 |
| PRE | L | L | H | BA3 | BA2 | BA1 | BA0 | L |
| PREA | L | L | H | BA3 | BA2 | BA1 | BA0 | H |
| WR | L | H | H | BA3 | BA2 | BA1 | BA0 | L |
| WRA | L | H | H | BA3 | BA2 | BA1 | BA0 | H |
| RD | L | H | L | BA3 | BA2 | BA1 | BA0 | L |
| RDA | L | H | L | BA3 | BA2 | BA1 | BA0 | H |

TABLE 3

| Command | UI8 | UI9 | UI10 | UI11 | UI12 | UI13 | UI14 | UI15 |
|---|---|---|---|---|---|---|---|---|
| NOP | V | V | V | V | V | V | V | PAR |
| ACT0 | RA13 | RA12 | RA11 | RA10 | RA9 | RA8 | RA7 | PAR |
| ACT1 | RA6 | RA5 | RA4 | RA3 | RA2 | RA1 | RA0 | PAR |
| REF | V | V | V | V | V | V | V | PAR |
| REFPB | V | V | V | V | V | V | V | PAR |
| MRS | OP6 | OP5 | OP4 | OP3 | OP2 | OP1 | OP0 | PAR |
| PRE | V | V | V | V | V | V | V | PAR |
| PREA | V | V | V | V | V | V | V | PAR |

TABLE 3-continued

| Command | UI8 | UI9 | UI10 | UI11 | UI12 | UI13 | UI14 | UI15 |
|---|---|---|---|---|---|---|---|---|
| WR  | V | CA5 | CA4 | CA3 | CA2 | CA1 | CA0 | PAR |
| WRA | V | CA5 | CA4 | CA3 | CA2 | CA1 | CA0 | PAR |
| RD  | V | CA5 | CA4 | CA3 | CA2 | CA1 | CA0 | PAR |
| RDA | V | CA5 | CA4 | CA3 | CA2 | CA1 | CA0 | PAR |

In such examples, a first three-unit interval (UI0-UI2) may supply a voltage to the memory device according to a voltage associated with a given command—e.g., a NOP (no operation command) may be associated with a low, low, low voltage. A next four-unit interval (UI3-UI6) may be associated with a bank or memory address in the memory device. An eighth unit interval (UI7) may be associated with any additional voltages associated with the given command or an operation code—e.g., the NOP command may not be associated with additional voltages. A subsequent seven-unit interval (UI8-UI4) may be associated with row addresses or column address. In the MRS command (mode register set command), these unit intervals may be associated with additional operation codes or indications for the memory device. A final unit interval (UI15) may be associated with a parity bit—e.g., error correction code to ensure the transmission of the command was proper. A "V" may indicate there was no signal or data communicated during that unit interval for the given command.

In some examples, the memory device may receive a NOP command—e.g., a no operation command associated with a debugging or other rest operation. The memory device may also receive an ACT0 command—e.g., an activate 0 command configured to activate a first portion of rows in the memory device. The memory device may also receive an ACT1 command—e.g., an activate 1 command configured to activate a second portion of rows in the memory device. In some cases, the memory device may receive a REF command—e.g., a refresh command configured to memory cells of memory cells in the memory device. In some instances, the memory device may receive a REFPB command—e.g., a refresh command configured to refresh banks of memory cells in the memory device. In some examples, the memory device may receive an MRS command—e.g., a mode register set command to set a mode register in the memory device to a specific value. In some cases, the memory device may receive a PRE command—e.g., a precharge command for specific banks in the memory device. In some instances, the memory device may receive a PREA command—e.g., a precharge command for some or all banks in the memory device. In some examples, the memory device may receive a WR command—e.g., a write command. In some instances, the memory device may receive a WRA command—e.g., a write command including a precharge operation as well. In some examples, the memory device may receive a RD command—e.g., a read command. In some instances, the memory device may receive an RDA command—e.g., a read command including a precharge operation as well.

Figure 9:
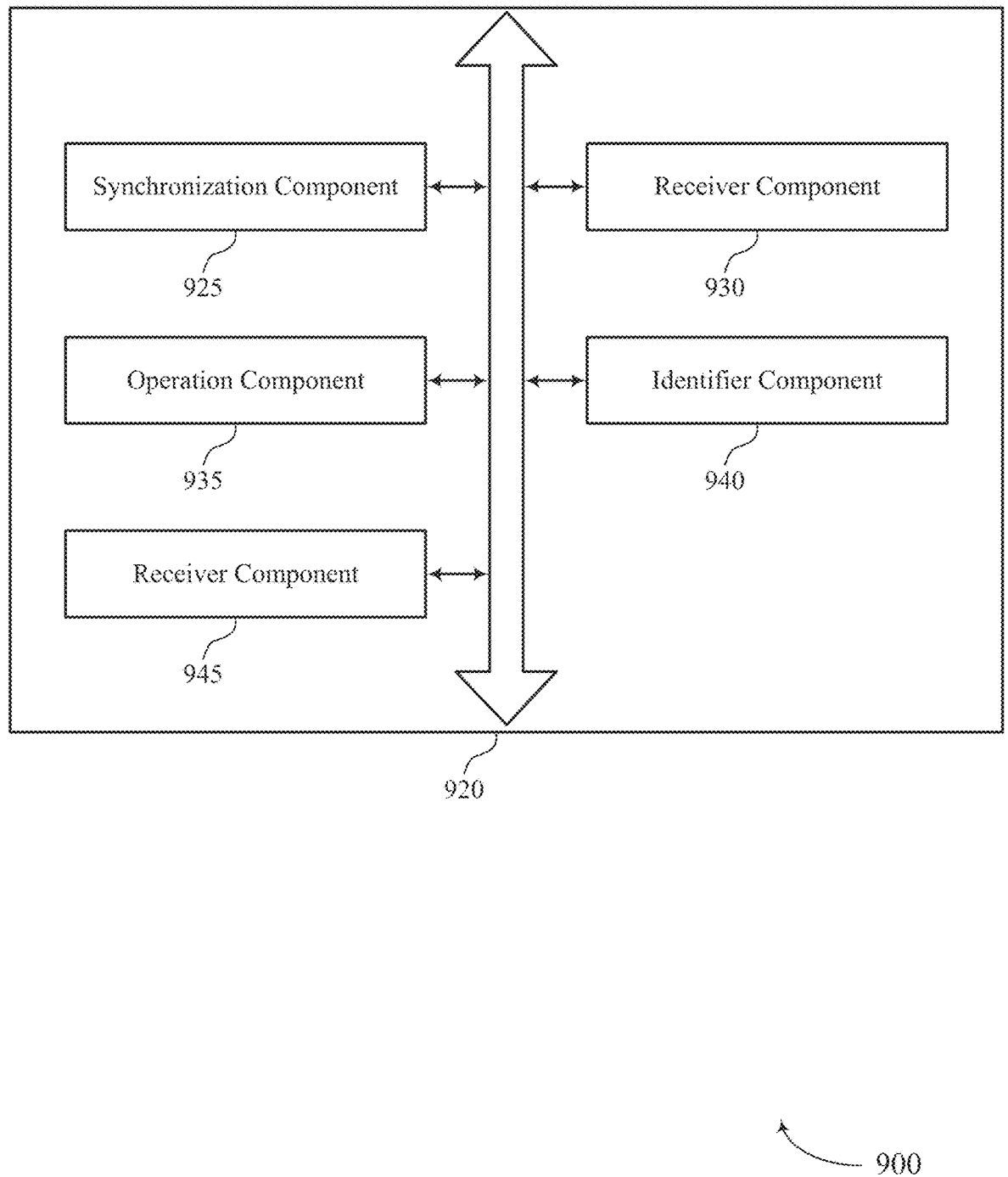
FIG. 9 shows a block diagram of a memory device that supports memory with fine grain architectures in accordance with examples as disclosed herein.

FIG. 9 shows a block diagram 900 of a memory device 920 that supports memory with fine grain architectures in accordance with examples as disclosed herein. The memory device 920 may be an example of aspects of a memory device as described with reference to FIGS. 1 through 8. The memory device 920, or various components thereof, may be an example of means for performing various aspects of memory with fine grain architectures as described herein. For example, the memory device 920 may include a synchronization component 925, a receiver component 930, an operation component 935, an identifier component 940, a receiver component 945, or any combination thereof. Each of these components may communicate, directly or indirectly, with one another (e.g., via one or more buses).

In some examples, the memory device 920 is coupled with a first organic substrate with a first pitch. In some examples, the first organic substrate is coupled with a second organic substrate with a second pitch larger than the first pitch. In some examples, a portion of a CA channel is routed through a conductive line in the first organic substrate.

The synchronization component 925 may be configured as or otherwise support a means for performing a synchronization procedure to synchronize a first clock of a host device associated with the CA channel with a second clock of a memory device associated with the CA channel. In some examples, to support performing the synchronization procedure, the synchronization component 925 may be configured as or otherwise support a means for synchronizing the second clock the memory device with the first frame boundary based at least in part on determining the first frame boundary.

The receiver component 930 may be configured as or otherwise support a means for receiving, over the CA channel based at least in part on performing the synchronization procedure, a command during a frame associated with a frame boundary of the CA channel. The operation component 935 may be configured as or otherwise support a means for performing, by the memory device, an operation associated with the command based at least in part on receiving the command.

In some examples, the identifier component 940 may be configured as or otherwise support a means for identifying the frame boundary of the frame using the second clock based at least in part on performing the synchronization procedure, where receiving the command is based at least in part on identifying the frame boundary.

In some cases, to support performing the synchronization procedure, the receiver component 945 may be configured as or otherwise support a means for receiving, from the host device, a signal including a training pattern of data. In some instances, to support performing the synchronization procedure, the identifier component 940 may be configured as or otherwise support a means for determining a first frame boundary of a first frame of the signal based at least in part on the training pattern of data included in the signal, the frame including more than one symbol.

In some examples, the receiver component 945 may be configured as or otherwise support a means for receiving, from the host device, a message indicating an ordered set of symbol values of a training frame of the training pattern of data, where determining the first frame boundary is based at least in part on receiving the message. In some examples, the training pattern of data received by the receiver component 945 includes a set of training frames that each include an ordered set of symbol values. In some cases, the command received by the receiver component 945 does not include a header. In some examples, the frame received by the receiver component 945 includes a quantity of unit intervals. In some instances, the quantity of unit intervals received by the receiver component 945 includes sixteen-unit intervals. In some examples, the frame associated with the CA channel includes a first quantity of unit intervals. In some cases, a second frame associated with a data channel between the memory device and the host device includes a second quantity of unit intervals. In some instances, the second quantity of unit intervals of the second frame associated with the data channel is twice as large as the first quantity of unit intervals of the frame associated with the CA channel.

Figure 10:
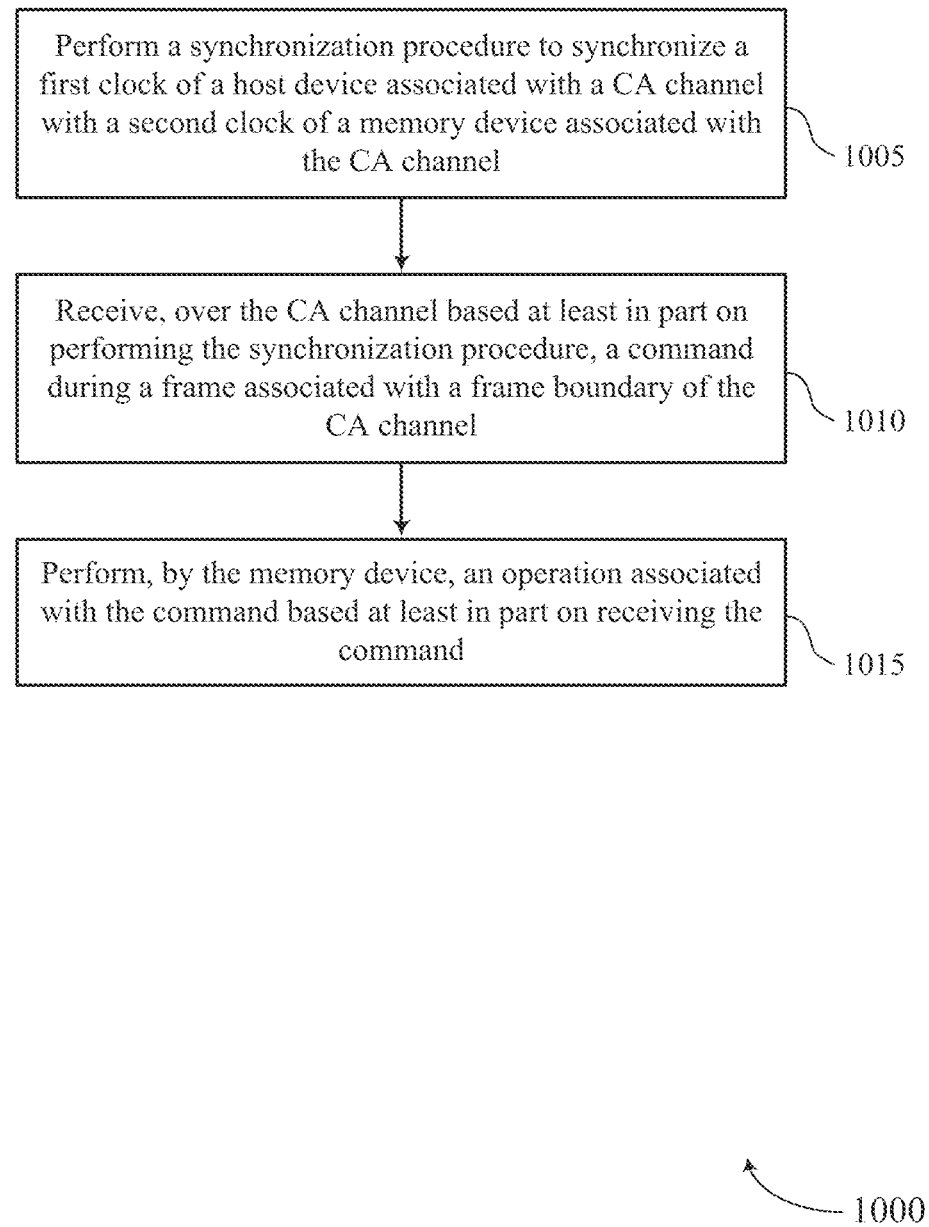
FIG. 10 shows a flowchart illustrating a method or methods that support memory with fine grain architectures in accordance with examples as disclosed herein.

FIG. 10 shows a flowchart illustrating a method 1000 that supports memory with fine grain architectures in accordance with examples as disclosed herein. The operations of method 1000 may be implemented by a memory device or its components as described herein. For example, the operations of method 1000 may be performed by a memory device as described with reference to FIGS. 1 through 9. In some examples, a memory device may execute a set of instructions to control the functional elements of the device to perform the described functions. Additionally or alternatively, the memory device may perform aspects of the described functions using special-purpose hardware.

At 1005, the method may include performing a synchronization procedure to synchronize a first clock of a host device associated with a CA channel with a second clock of a memory device associated with the CA channel. The operations of 1005 may be performed in accordance with examples as disclosed herein. In some examples, aspects of the operations of 1005 may be performed by a synchronization component 925 as described with reference to FIG. 9.

At 1010, the method may include receiving, over the CA channel based at least in part on performing the synchronization procedure, a command during a frame associated with a frame boundary of the CA channel. The operations of 1010 may be performed in accordance with examples as disclosed herein. In some examples, aspects of the operations of 1010 may be performed by a receiver component 930 as described with reference to FIG. 9.

At 1015, the method may include performing, by the memory device, an operation associated with the command based at least in part on receiving the command. The operations of 1015 may be performed in accordance with examples as disclosed herein. In some examples, aspects of the operations of 1015 may be performed by an operation component 935 as described with reference to FIG. 9.

In some examples, an apparatus as described herein may perform a method or methods, such as the method 1000. The apparatus may include, features, circuitry, logic, means, or instructions (e.g., a non-transitory computer-readable medium storing instructions executable by a processor) for performing a synchronization procedure to synchronize a first clock of a host device associated with a CA channel with a second clock of a memory device associated with the CA channel, receiving, over the CA channel based at least in part on performing the synchronization procedure, a command during a frame associated with a frame boundary of the CA channel, and performing, by the memory device, an operation associated with the command based at least in part on receiving the command.

Some cases of the method 1000 and the apparatus described herein may further include operations, features, circuitry, logic, means, or instructions for identifying the frame boundary of the frame using the second clock based at least in part on performing the synchronization procedure, where receiving the command may be based at least in part on identifying the frame boundary.

In some instances of the method 1000 and the apparatus described herein, the memory device may be coupled with a first organic substrate with a first pitch, the first organic substrate may be coupled with a second organic substrate with a second pitch larger than the first pitch, and a portion of the CA channel may be routed through a conductive line in the first organic substrate.

In some examples of the method 1000 and the apparatus described herein, performing the synchronization procedure may include operations, features, circuitry, logic, means, or instructions for receiving, from the host device, a signal including a training pattern of data, determining a first frame boundary of a first frame of the signal based at least in part on the training pattern of data included in the signal, the frame including more than one symbol, and synchronizing the second clock the memory device with the first frame boundary based at least in part on determining the first frame boundary.

Some cases of the method 1000 and the apparatus described herein may further include operations, features, circuitry, logic, means, or instructions for receiving, from the host device, a message indicating an ordered set of symbol values of a training frame of the training pattern of data, where determining the first frame boundary may be based at least in part on receiving the message.

In some instances of the method 1000 and the apparatus described herein, the training pattern of data includes a set of training frames that each include an ordered set of symbol values.

In some examples of the method 1000 and the apparatus described herein, the command does not include a header.

In some cases of the method 1000 and the apparatus described herein, the frame includes a quantity of unit intervals.

In some instances of the method 1000 and the apparatus described herein, the quantity of unit intervals includes sixteen unit intervals.

In some examples of the method 1000 and the apparatus described herein, the frame associated with the CA channel includes a first quantity of unit intervals and a second frame associated with a data channel between the memory device and the host device includes a second quantity of unit intervals.

In some cases of the method 1000 and the apparatus described herein, the second quantity of unit intervals of the second frame associated with the data channel may be twice as large as the first quantity of unit intervals of the frame associated with the CA channel.

It should be noted that the methods described herein describe possible implementations, and that the operations and the steps may be rearranged or otherwise modified and that other implementations are possible. Further, portions from two or more of the methods may be combined.

An apparatus is described. The apparatus may include a memory device, a first organic substrate including a plurality of first conductive lines arranged with a first pitch, the plurality of first conductive lines configured to power one or more components of the memory device, and a second organic substrate coupled with the memory device and the first organic substrate, the second organic substrate including a plurality of second conductive lines arranged with a second pitch smaller than the first pitch, where the plurality of second conductive lines routed through the second organic substrate are configured to couple the memory device with a host device.

In some examples of the apparatus, the first pitch of the first organic substrate includes may be greater than or equal to ten micrometers and the second pitch of the second organic substrate may be less than or equal to two micrometers.

In some instances of the apparatus, the first organic substrate includes one or more of a first line parameter or a first space parameter that may be greater than or equal to ten micrometers and the second organic substrate includes one or more of a second line or a second space parameter that may be less than or equal to two micrometers.

In some cases of the apparatus, the memory device includes a plurality of memory arrays that include a first memory array and a second memory array stacked on the first memory array, one or more column positions may be common to each memory array of the plurality of memory arrays, the first memory array includes a first I/O circuit coupled with a first TSV, the first I/O circuit positioned at a first column position and the first TSV positioned at a second column position, the first memory array including a conductive path configured to route a second TSV of the first memory array at a third column position to a third TSV of the second memory array positioned at the second column position, and the second memory array including a second I/O circuit coupled with the third TSV, the second I/O circuit positioned at the first column position and the second TSV positioned at the second column position.

In some examples of the apparatus, the first memory array includes a fourth TSV at a fourth column position, the second memory array includes a fifth TSV at the fourth column position, the fifth TSV coupled with the fourth TSV at the fourth column position, the fourth TSV and the fifth TSV may be configured to transfer power to the first memory array and the second memory array, the first TSV configured to communicate data between the first memory array and the host device, and the second TSV and the third TSV may be configured to communicate data between the second memory array and the host device.

In some instances of the apparatus, the memory device includes a plurality of memory arrays that include a first memory array and a second memory array stacked on the first memory array, one or more column positions may be common to each memory array of the plurality of memory arrays and each memory array of the plurality of memory arrays may be configured to route signals from a first TSV at a first column position to a second TSV at a second column position.

In some cases of the apparatus, the memory device includes a first memory array including one or more memory cells, a first I/O area extending in a first direction through the first memory array and dividing the first memory array into a first portion and a second portion, and one or more second I/O areas extending a second direction through the first memory array, each of the one or more second I/O areas extending through the first portion and the second portion, and wherein the first I/O area and the one or more second I/O areas occupy an area of the first memory array that is devoid of memory cells.

In some examples of the apparatus, an I/O area of the one or more second I/O areas includes a plurality of channels configured to communicate information between a region of memory cells of the first memory array and the host device, the region of memory cells including one or more banks of memory cells positioned near the I/O area that includes the plurality of channels.

In some instances of the apparatus, the one or more second I/O areas may be distributed throughout the first memory array to be near a plurality of regions of the first memory array.

In some cases of the apparatus, an interface between the second organic substrate and the memory device, the interface including a pattern of contacts configured to route signals to different regions of the memory device, where at least some of the pattern of contacts may be positioned beneath the one or more second I/O areas.

In some examples of the apparatus, the memory device includes a plurality of channels configured to communicate information between a region of memory cells of a first memory array and the host device, the region of memory cells including one or more banks of memory cells positioned near an I/O area of the first memory array that includes the plurality of channels.

In some cases of the apparatus, the plurality of channels includes one or more channels configured to communicate data between the region of memory cells and the host device, a command/address channel configured to communicate commands and address information from the host device to the first memory array, and one or more other channels.

In some instances of the apparatus, a channel of the plurality of channels includes a third conductive line coupling a memory cell in the region of memory cells with a first interface in the first memory array, a fourth conductive line coupling the first interface in the first memory array with a second interface of the memory device, the fourth conductive line passing through one or more additional layers of the memory device, and the plurality of second conductive lines coupling the second interface of the memory device with the host device.

In some examples of the apparatus, the memory device includes a plurality of channels configured to communicate information between a first region of memory cells of a first memory array and the host device and a second region of memory cells of the first memory array and the host device, the first region of memory cells and the second region of memory cells including one or more banks of memory cells positioned near an I/O area of the first memory array that includes the plurality of channels.

In some instances of the apparatus, the plurality of channels includes a first set of channels dedicated to the first region of memory cells, a second set of channels dedicated to the second region of memory cells, and a third set of channels shared by the first region of memory cells and the second region of memory cells.

In some cases of the apparatus, the memory device includes a layer including one or more circuits to operate the memory device, a first memory array including one or more memory cells, and a second memory array including one or more memory cells.

In some instances of the apparatus, the one or more circuits of the layer include self-test circuits to test one or more aspects of the first memory array or the second memory array.

In some cases of the apparatus, the one or more circuits in the layer may be not configured to buffer signals communicated over the plurality of second conductive lines.

In some examples of the apparatus, a second conductive line of the plurality of second conductive lines includes a portion of a point-to-point connection between the host device and a memory cell of the memory device.

In some cases of the apparatus, a second conductive line of the plurality of second conductive lines may have a first impedance that may be less than a second impedance than a conductive line of a silicon interposer.

Another apparatus is described. The apparatus may include a memory device, a first organic substrate including a first conductive line with a first pitch, the first organic substrate including a plane for powering one or more components of the memory device, a second organic substrate coupled with the first organic substrate and including a second conductive line with a second pitch smaller than the first pitch, the second conductive line routed through the second organic substrate couples the memory device with a host device, the memory device is coupled with the second organic substrate, and a controller associated with the memory device and configured to cause the apparatus to perform a synchronization procedure to synchronize a first clock of the host device associated with a CA channel with a second clock of the memory device associated with the CA channel, receive, over the CA channel based at least in part on performing the synchronization procedure, a command during a frame associated with a frame boundary of the CA channel, and perform, by the memory device, an operation associated with the command based at least in part on receiving the command.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal, however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

As used herein, the term "substantially" means that the modified characteristic (e.g., a verb or adjective modified by the term substantially) need not be absolute but is close enough to achieve the advantages of the characteristic.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
  a memory device, wherein the memory device comprises a plurality of memory arrays that include a first memory array and a second memory array stacked on the first memory array, one or more column positions are common to each memory array of the plurality of memory arrays;
  a first organic substrate comprising a plurality of first conductive lines arranged with a first pitch, the plurality of first conductive lines configured to power one or more components of the memory device; and
  a second organic substrate coupled with the memory device and the first organic substrate, the second organic substrate comprising a plurality of second conductive lines arranged with a second pitch smaller than the first pitch, wherein the plurality of second conductive lines routed through the second organic substrate are configured to couple the memory device with a host device.

2. The apparatus of claim 1, wherein:
  the first pitch of the first organic substrate is greater than or equal to ten micrometers; and
  the second pitch of the second organic substrate is less than or equal to two micrometers.

3. The apparatus of claim 1, wherein:
  the first organic substrate includes one or more of a first line parameter or a first space parameter that is greater than or equal to ten micrometers; and
  the second organic substrate includes one or more of a second line or a second space parameter that is less than or equal to two micrometers.

4. The apparatus of claim 1, wherein:
  the first memory array includes a first input/output (I/O) circuit coupled with a first through-silicon via (TSV), the first I/O circuit positioned at a first column position and the first TSV positioned at a second column position;
  the first memory array including a conductive path configured to route a second TSV of the first memory array at a third column position to a third TSV of the second memory array positioned at the second column position; and
  the second memory array including a second I/O circuit coupled with the third TSV, the second I/O circuit positioned at the first column position and the second TSV positioned at the second column position.

5. The apparatus of claim 4, wherein:
the first memory array includes a fourth TSV at a fourth column position;
the second memory array includes a fifth TSV at the fourth column position, the fifth TSV coupled with the fourth TSV at the fourth column position;
the fourth TSV and the fifth TSV are configured to transfer power to the first memory array and the second memory array;
the first TSV configured to communicate data between the first memory array and the host device; and
the second TSV and the third TSV are configured to communicate data between the second memory array and the host device.

6. The apparatus of claim 1, wherein:
each memory array of the plurality of memory arrays is configured to route signals from a first through-silicon via (TSV) at a first column position to a second TSV at a second column position.

7. The apparatus of claim 1, wherein the memory device comprises:
the first memory array comprising:
one or more memory cells;
a first input/output (I/O) area extending in a first direction through the first memory array and dividing the first memory array into a first portion and a second portion; and
one or more second I/O areas extending a second direction through the first memory array, each of the one or more second I/O areas extending through the first portion and the second portion;
wherein the first I/O area and the one or more second I/O areas occupy an area of the first memory array that is devoid of memory cells.

8. The apparatus of claim 7, wherein an I/O area of the one or more second I/O areas comprises a plurality of channels configured to communicate information between a region of memory cells of the first memory array and the host device, the region of memory cells comprising one or more banks of memory cells positioned near the I/O area that includes the plurality of channels.

9. The apparatus of claim 7, wherein the one or more second I/O areas are distributed throughout the first memory array to be near a plurality of regions of the first memory array.

10. The apparatus of claim 7, further comprising:
an interface between the second organic substrate and the memory device, the interface comprising a pattern of contacts configured to route signals to different regions of the memory device, wherein at least some of the pattern of contacts are positioned beneath the one or more second I/O areas.

11. The apparatus of claim 1, wherein the memory device comprises:
a plurality of channels configured to communicate information between a region of memory cells of the first memory array and the host device, the region of memory cells comprising one or more banks of memory cells positioned near an I/O area of the first memory array that includes the plurality of channels.

12. The apparatus of claim 11, wherein the plurality of channels comprises:
one or more channels configured to communicate data between the region of memory cells and the host device,
a command/address channel configured to communicate commands and address information from the host device to the first memory array, and
one or more other channels.

13. The apparatus of claim 11, wherein a channel of the plurality of channels comprises:
a third conductive line coupling a memory cell in the region of memory cells with a first interface in the first memory array;
a fourth conductive line coupling the first interface in the first memory array with a second interface of the memory device, the fourth conductive line passing through one or more additional layers of the memory device; and
the plurality of second conductive lines coupling the second interface of the memory device with the host device.

14. The apparatus of claim 1, wherein the memory device comprises:
a plurality of channels configured to communicate information between a first region of memory cells of the first memory array and the host device and a second region of memory cells of the first memory array and the host device, the first region of memory cells and the second region of memory cells comprising one or more banks of memory cells positioned near an I/O area of the first memory array that includes the plurality of channels.

15. The apparatus of claim 14, wherein the plurality of channels comprises:
a first set of channels dedicated to the first region of memory cells;
a second set of channels dedicated to the second region of memory cells; and
a third set of channels shared by the first region of memory cells and the second region of memory cells.

16. The apparatus of claim 1, wherein the memory device comprises:
a layer comprising one or more circuits to operate the memory device;
the first memory array comprising one or more memory cells; and
the second memory array comprising one or more memory cells.

17. The apparatus of claim 16, wherein the one or more circuits of the layer comprise self-test circuits to test one or more aspects of the first memory array or the second memory array.

18. The apparatus of claim 16, wherein the one or more circuits in the layer are not configured to buffer signals communicated over the plurality of second conductive lines.

19. The apparatus of claim 1, wherein a second conductive line of the plurality of second conductive lines comprises a portion of a point-to-point connection between the host device and a memory cell of the memory device.

20. The apparatus of claim 1, wherein a second conductive line of the plurality of second conductive lines has a first impedance that is less than a second impedance than a conductive line of a silicon interposer.

21. A method, comprising:
performing a synchronization procedure to synchronize a first clock of a host device associated with a command/address (CA) channel with a second clock of a memory device associated with the CA channel;

receiving, over the CA channel based at least in part on performing the synchronization procedure, a command during a frame associated with a frame boundary of the CA channel; and performing, by the memory device, an operation associated with the command based at least in part on receiving the command.

22. The method of claim 21, further comprising:
identifying the frame boundary of the frame using the second clock based at least in part on performing the synchronization procedure, wherein receiving the command is based at least in part on identifying the frame boundary.

23. The method of claim 21, wherein:
the memory device is coupled with a first organic substrate with a first pitch;
the first organic substrate is coupled with a second organic substrate with a second pitch larger than the first pitch; and
a portion of the CA channel is routed through a conductive line in the first organic substrate.

24. The method of claim 21, wherein performing the synchronization procedure comprises:
receiving, from the host device, a signal comprising a training pattern of data;
determining a first frame boundary of a first frame of the signal based at least in part on the training pattern of data included in the signal, the frame comprising more than one symbol; and
synchronizing the second clock the memory device with the first frame boundary based at least in part on determining the first frame boundary.

25. The method of claim 24, further comprising:
receiving, from the host device, a message indicating an ordered set of symbol values of a training frame of the training pattern of data, wherein determining the first frame boundary is based at least in part on receiving the message.

26. The method of claim 24, wherein the training pattern of data comprises a set of training frames that each comprise an ordered set of symbol values.

27. The method of claim 21, wherein the command does not include a header.

28. The method of claim 21, wherein the frame comprises a quantity of unit intervals.

29. The method of claim 28, wherein the quantity of unit intervals comprises sixteen unit intervals.

30. The method of claim 21, wherein:
the frame associated with the CA channel comprises a first quantity of unit intervals; and
a second frame associated with a data channel between the memory device and the host device comprises a second quantity of unit intervals.

31. The method of claim 30, wherein the second quantity of unit intervals of the second frame associated with the data channel is twice as large as the first quantity of unit intervals of the frame associated with the CA channel.

32. An apparatus, comprising:
a memory device;
a first organic substrate comprising a first conductive line with a first pitch, the first organic substrate comprising a plane for powering one or more components of the memory device;
a second organic substrate coupled with the first organic substrate and comprising a second conductive line with a second pitch smaller than the first pitch, the second conductive line routed through the second organic substrate couples the memory device with a host device, the memory device is coupled with the second organic substrate; and
a controller associated with the memory device and configured to cause the apparatus to:
perform a synchronization procedure to synchronize a first clock of the host device associated with a command/address (CA) channel with a second clock of the memory device associated with the CA channel;
receive, over the CA channel based at least in part on performing the synchronization procedure, a command during a frame associated with a frame boundary of the CA channel; and
perform, by the memory device, an operation associated with the command based at least in part on receiving the command.

* * * * *